United States Patent [19]

Ogawa et al.

[11] Patent Number: 5,670,297
[45] Date of Patent: Sep. 23, 1997

[54] PROCESS FOR THE FORMATION OF A METAL PATTERN

[75] Inventors: Tohru Ogawa; Hiroyuki Nakano, both of Kanagawa, Japan

[73] Assignee: Sony Corporation, Tokyo, Japan

[21] Appl. No.: 556,426

[22] Filed: Nov. 9, 1995

Related U.S. Application Data

[63] Continuation-in-part of Ser. No. 175,299, Dec. 29, 1993, Pat. No. 5,472,827, which is a continuation-in-part of Ser. No. 998,743, Dec. 30, 1992, abandoned.

[30] Foreign Application Priority Data

| Dec. 30, 1991 | [JP] | Japan | 3-360521 |
| Dec. 30, 1991 | [JP] | Japan | 3-360523 |
| Mar. 11, 1992 | [JP] | Japan | 4-087911 |
| Mar. 11, 1992 | [JP] | Japan | 4-087912 |
| Aug. 20, 1992 | [JP] | Japan | 4-244314 |
| Oct. 31, 1992 | [JP] | Japan | 4-316073 |
| Dec. 29, 1992 | [JP] | Japan | 4-359750 |
| Aug. 8, 1994 | [JP] | Japan | 6-186184 |

[51] Int. Cl.$^6$ ........................... G03F 7/38
[52] U.S. Cl. ............ 430/318; 430/272.1; 430/275.1; 430/512; 430/524; 430/525; 430/526; 430/950
[58] Field of Search ............ 430/325, 326, 430/159, 166, 510, 512, 523, 524, 525, 526, 950, 272.1, 275.1, 313, 318

[56] References Cited

U.S. PATENT DOCUMENTS

| 4,407,927 | 10/1983 | Kamoshida et al. | 430/197 |
| 4,737,447 | 4/1988 | Suzuki et al. | 430/321 |
| 5,077,185 | 12/1991 | Cho et al. | 430/523 |
| 5,194,712 | 3/1993 | Jones | 219/121.67 |
| 5,362,598 | 11/1994 | Takeyama et al. | 430/191 |
| 5,468,606 | 11/1995 | Bogart et al. | 435/5 |
| 5,472,827 | 12/1995 | Ogawa et al. | 430/315 |
| 5,472,829 | 12/1995 | Ogawa | 430/325 |

FOREIGN PATENT DOCUMENTS

| 1241125 | 9/1989 | Japan . |
| 2148731 | 6/1990 | Japan . |

*Primary Examiner*—Christopher G. Young
*Attorney, Agent, or Firm*—Hill, Steadman & Simpson

[57] ABSTRACT

A process for formation of a metal pattern comprising the steps of forming a silicide metal film on an underlying substrate, forming an anti-reflection film on the underlying substrate on which the silicide metal film is formed, forming a resist film on the anti-reflection film, patterning the resist film by photolithography to form a predetermined pattern, and using the thus patterned resist film as a mask and etching the silicide metal film on the underlying substrate, wherein the optical constants and the thickness of the anti-reflection film are determined to give the smallest standing wave effect at the time of photolithography in accordance with the type of the silicide metal film.

33 Claims, 19 Drawing Sheets

$\lambda = 248nm$  SiO₂/SiOxNy:H/Ti-Si $\lambda = 248nm$, $n = 2.1$  SiO₂/SiOxNy:H/Ti-Si

PROCESS FOR THE FORMATION OF A METAL PATTERN

This application is a continuation in part of application Ser. No. 08/175,299 filed Dec. 29, 1993 now U.S. Pat. No. 5,472,827 which is a continuation in part of application Ser. No. 07/998,743 filed Dec. 30, 1992, now abandoned.

BACKGROUND OF THE INVENTION

1. Field of the Invention

The present invention relates to a process for the production of a pattern of a silicide metal having a smaller specific resistance than even the specific resistance of $Wsi_x$, such as a silicide metal selected from a group consisting of $TiSi_2$, $CoSi_2$, PtSi, and NiSi.

2. Description of the Related Art

One of the major problems when using photolithography to form fine patterns is the variation in the line width of the patterns. In recent years, the reduction of the design rule has led to increased variations in the width of interconnections. Some of the causes behind these variations in the width of interconnections are believed to be the steps on the underlying substrate and the density of the patterns.

Along with the reduction of the design rule, the wavelength of exposure in the photolithographic process has been shortened from the g-rays (436 nm) to i-rays (365 nm) and further to the KrF excimer laser (248 nm). As shown in FIG. 1, when forming a resist film 2 on an underlying substrate 4 and patterning that resist film by photolithography, there is a greater effect of multiple interference the shorter the exposure wavelength. This is due to the fact that the cycle of the multiple interference becomes smaller and the reflectance of the substrate becomes greater. The shortening of the exposure wavelength leads to a greater effect of multiple interference, so the variations in the width of interconnections when the thickness of the resist changes become greater, as shown in FIG. 2. Steps on the underlying substrate cause changes in the thickness of the resist and variations in the width of interconnections due to the above reason.

One of the techniques used to suppress variations in the width of interconnections in patterns is the anti-reflection technique as shown in FIG. 3 and FIG. 4. This technique, as shown in FIG. 3 and FIG. 4, is one which places an organic film or inorganic film with a light absorbing property above or below the resist film 2 to give a light absorbing action and phase canceling action and thereby keep the amount of light absorbed in the resist film 2 constant and hold down variations in the width of interconnections even if the resist film changes in thickness. One anti-reflection technique is to place a transparent organic film on the top of the resist film 2 and to make use of the phase canceling action with the transparency of the organic film (one of n=1.3) so as to make the amount of light absorbed in the resist film 2 constant.

When using a high reflectance substrate, compared with the case where no anti-reflection film is provided on the underlying substrate 4 as shown in FIG. 5A, provision of an anti-reflection film 8 as shown in FIG. 5B is advantageous in the sense that a smaller amount of light is reflected in various directions at the step 10 and in the sense of prevention of variations in the width of interconnections and prevention of halation. That is, from the viewpoints of prevention of variations in the width of interconnections and prevention of halation, it is desirable to interpose an anti-reflection film between the underlying substrate and the resist film.

On the other hand, consider the case of an actual device pattern. The design rule of devices is becoming smaller. The same can be said for the pattern of the gate electrodes. At the present time, as shown in FIG. 6, a gate electrode is configured by a tungsten silicide-polycrystalline silicon construction etc. of a $WSi_x$ or other silicide layer 14 laid on top of a polycrystalline silicon layer 12. The reduction in size of the pattern of a gate electrode and the accompanying reduction in thickness of the film, however, have resulted in a rise in the resistance of the gate electrode. Therefore, the miniaturization of gate electrode has made it necessary to give consideration to application of silicide metals with resistances smaller than even $WSi_x$ for the gate electrode.

The $P^+$, $As^+$, $B^+$, $BF^+$, and other impurity ions implanted into the diffusion layer also can no longer reach down to the silicon substrate due to the miniaturization of patterns. Therefore, the diffusion layers have become shallower and the resistances greater. Accordingly, as shown for example in FIG. 7, it is necessary to treat the surface of the diffusion layer 16 formed on the surface of the semiconductor substrate 4 by silicidation etc. to form a silicide layer 18 and lower the resistance.

FIG. 8 shows the overall configuration when using a silicide for the surface of the diffusion layer and the gate electrode etc.

As shown in FIG. 8, a predetermined pattern of an element-isolation regions (LOCOS) 21, a gate insulating film 22, and a gate electrode 15 are formed on the surface of the semiconductor substrate 4. A silicide layer 18 is formed by silicidation on the surface of the source-drain diffusion layer 16 positioned at the two sides of the gate electrode 15. The gate electrode 15 is configured by a polycrystalline silicon layer 12 and silicide layer 14.

On the gate electrode 15 is formed a first interlayer insulating layer 22 comprised of silicon oxide etc. Its contact hole is filled with a tungsten bracket 24 through the diffusion layer 16. An aluminum interconnection layer 26 is connected so as to connect to the tungsten bracket 24. On the aluminum interconnection layer 26 is formed a second interlayer insulating layer 28 comprised of silicon oxide. Its contact hole is filled by a tungsten bracket 30 connecting with the gate electrode 15.

The tungsten bracket 30 has connected to it a tungsten layer 32. A third interlayer insulating film 34 is formed on the tungsten layer 32.

In this case, there are steps formed on the device pattern. When patterning the resist, therefore, the problem of a standing wave effect (thin film interference effect) arises. The problem of the standing wave effect also arises due to use of the high reflectance tungsten etc. for the interconnection material.

Further, along with the miniaturization of semiconductor devices, attempts have been made to make the silicide layer 14 or 18 shown in FIG. 18 by a silicide metal with a specific resistance lower than even $WSi_x$ and thereby to further reduce the resistance. Examples of silicide metals with specific resistances lower than even $WSi_x$ include $TiSi_2$, $CoSi_2$, PtSi, and NiSi.

SUMMARY OF THE INVENTION

The present invention was made in consideration of the above problems and has as its object to provide a process enabling the formation of a fine pattern of a silicide metal having a specific resistance lower than even the specific resistance of $Wsi_x$, such as a silicide metal selected from a group consisting of $TiSi_2$, $CoSi_2$, PtSi, and NiSi, with little variation in the width of interconnections. Further, it has as its object the provision of a process enabling formation of a fine pattern of tungsten with little variation in the width of interconnections.

To achieve the above object, according to a first aspect of the present invention, there is provided a process for formation of a metal pattern comprising the steps of forming a silicide metal film on an underlying substrate, forming an anti-reflection film on the underlying substrate on which the metal film is formed, forming a resist film on the anti-reflection film, patterning the resist film by photolithography to form a predetermined pattern, and using the thus patterned resist film as a mask and etching the silicide metal film on the underlying substrate, wherein the optical constants and the thickness of the anti-reflection film are determined to give the smallest standing wave effect at the time of the photolithography in accordance with the type of the silicide metal film.

The silicide film may be formed by forming a metal film serving as the basis of the silicide metal on the underlying substrate so that at least a part contacts the surface of the silicon, then applying a heat treatment. Alternatively, the silicide film may be formed directly by a chemical vapor deposition (CVD) method.

It is also possible to form an anti-reflection film on the silicide metal film, form an interlayer film on the anti-reflection film, form the resist film on the interlayer film, and then perform the photolithography.

Alternatively, it is possible to form an interlayer film on the silicide metal film, form an anti-reflection film on the interlayer film, form a resist film on the anti-reflection film, and then perform the photolithography.

In this aspect of the invention, since the optical constants and the thickness of the anti-reflection film are determined to give the smallest standing wave effect at the time of the photolithography in accordance with the type of the silicide metal film, it is possible to form an extremely well patterned silicide metal film with little variation in the width of the interconnections. If use is made of the a silicide metal with a specific resistance smaller than even the resistance of $WSi_x$ such as $TiSi_2$, $CoSi_2$, PtSi, and NiSi as the silicide metal film, it is possible to compensate for the increase in resistance accompanying the miniaturization of the pattern and thereby to lower the resistance.

According to another aspect of the invention, there is provided a process for a formation of a metal pattern comprising the steps of forming a metal film serving as the basis of a silicide metal on an underlying substrate so that at least a part contacts the surface of the silicon, forming an anti-reflection film on the underlying substrate on which the metal film is formed, forming a resist film on this anti-reflection film, patterning the resist film by photolithography to form a predetermined pattern, using the thus patterned resist film as a mask and etching the metal film on the underlying substrate, and applying heat treatment to the thus etched metal film to convert the metal film to a silicide, wherein the optical constants and the thickness of the anti-reflection film are determined to give the smallest standing wave effect at the time of the photolithography in accordance with the type of the metal film.

The silicide metal film is preferably made of a silicide metal with a specific resistance smaller than even the resistance of $WSi_x$, such as $TiSi_2$, $CoSi_2$, PtSi, and NiSi. The specific resistance of $WSi_x$ is 30 to 70 μΩ cm, that of $TiSi_2$ is 13 to 16 μΩ cm, that of $CoSi_2$ is 10 to 18 μΩ cm, that of PtSi is 28 to 35 μΩ cm, and that of NiSi is under 50 μΩ cm (M. Sze, "VLSI Technology," 2nd edition, p. 383, Table 3).

In this aspect of the process for the formation of a metal pattern according to the present invention, it is possible to apply photolithography and etching, using the anti-reflection film, to the metal film serving as the basis of the silicide metal so as to form a fine pattern with little variation of the width of the interconnections, then apply a heat treatment to convert this to a silicide and thereby obtain a finely patterned silicide metal film. If use is made of a silicide metal with a specific resistance smaller than even the resistance of $WSi_x$ such as $TiSi_2$, $CoSi_2$, PtSi, and NiSi as the silicide metal film, it is possible to compensate for the increase in the resistance accompanying the miniaturization of patterns and thereby to lower the resistance.

According to another aspect of the invention, there is provided a process for formation of a metal pattern comprising the steps of forming a tungsten metal film on an underlying substrate, forming an anti-reflection film on the tungsten metal film directly or through an interlayer film, forming a resist film on this anti-reflection film, patterning the resist film by photolithography to form a predetermined pattern, and using the thus patterned resist film as a mask and etching the interlayer film or tungsten metal film on the underlying substrate, wherein the optical constants and the thickness of the anti-reflection film are determined to give the smallest standing wave effect at the time of photolithography in accordance with the optical constants of the tungsten metal film.

The anti-reflection film is preferably an $SiO_xN_y$:H film or $Si_xN_y$ film formed by the CVD method, sputtering method, or reactive sputtering method.

In this aspect of the invention, since the optical constants and the thickness of the anti-reflection film are determined to give the smallest standing wave effect at the time of the photolithography in accordance with the optical constants of the tungsten metal film, it becomes possible to finely pattern the tungsten metal film or the interlayer film on it while keeping the variations of the width of interconnections to a minimum.

BRIEF DESCRIPTION OF THE DRAWINGS

These and other objects and features of the present invention will become clearer from the following description of the preferred embodiments given with reference to the drawings, wherein:

FIGS. 10A and 10B are schematic cross-sectional views of another process for formation of a silicide layer on a gate electrode, while

FIGS. 26A and 23B are schematic cross-sectional views of the position of the formation of the anti-reflection film used in a ninth example of the present invention;

DESCRIPTION OF THE PREFERRED EMBODIMENTS

Before explaining the preferred embodiments of the present invention, an explanation will be made of the process for forming the silicide metal on the gate electrode and diffusion layer.

Figure 9A:
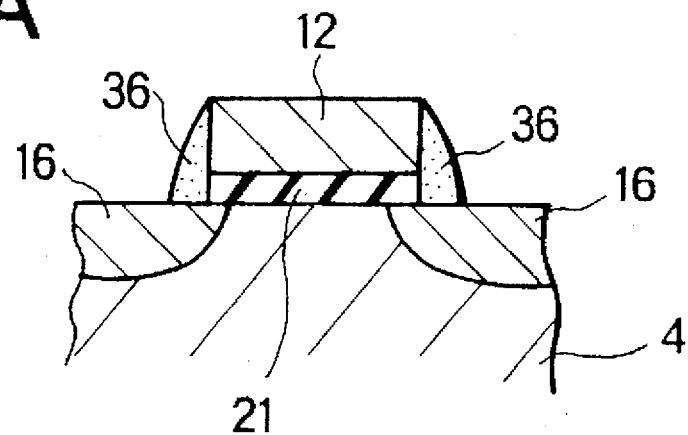
FIGS. 9A to 9C are cross-sectional views showing the steps of the process for forming a silicide layer on a gate electrode and diffusion layer.

To form a silicide metal on the gate electrode and diffusion layer, as shown in FIG. 9A, a gate insulating film 21 is formed on the semiconductor substrate 4, then a polycrystalline silicon layer 12 for forming the gate electrode is formed on the surface of the same. The polycrystalline silicon layer 12 is etched to the pattern of the gate electrode, then insulating side walls 36 are formed at the sides of the gate electrode 12 and a diffusion layer 16 for the source-drain region is formed on the surface of the semiconductor substrate.

Figure 9B:
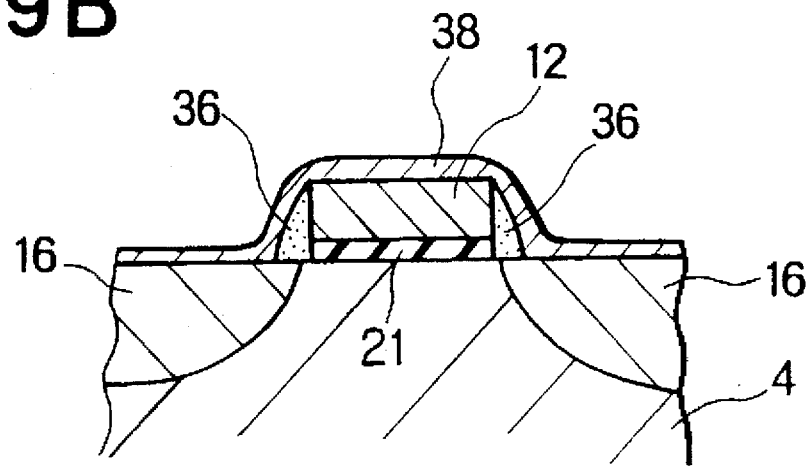
Figure 9C:
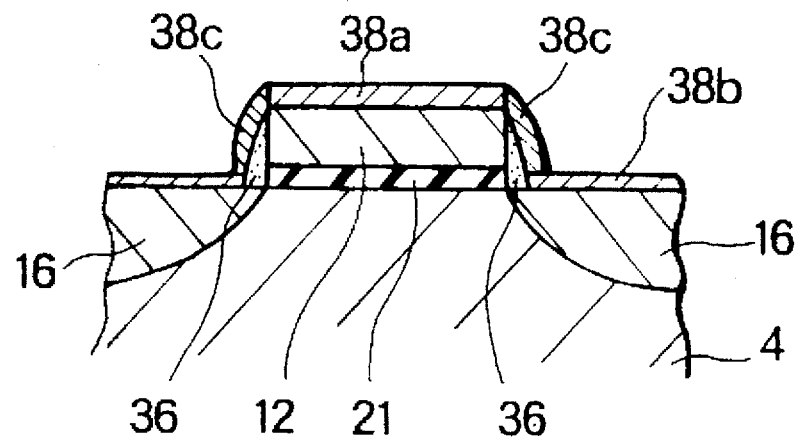

Next, as shown in FIG. 9B, a refractory metal layer 38 made of titanium, cobalt, platinum, nickel, or the like and serving as the basis for the silicide metal is deposited on the polycrystalline silicon layer 12 and semiconductor substrate 4. Next, RTA, laser annealing, or other heat treatment is applied to convert the metal layer at the portion in contact with the silicon into a silicide and, as shown in FIG. 9C, form the silicide layers 38a and 38b. The metal layer 38c on the insulating side walls 36 is not converted into a silicide and is removed by etching at a subsequent step.

Figure 10A:
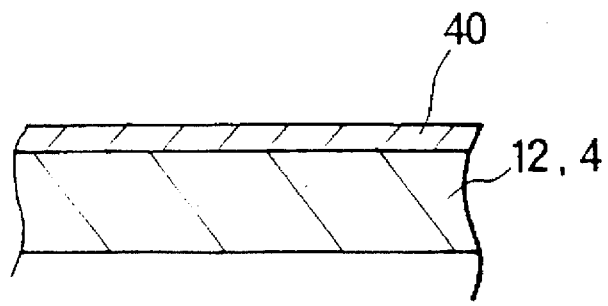
Figure 10B:
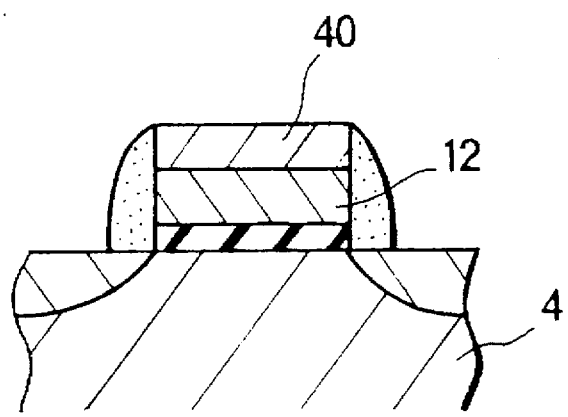
Figure 10C:
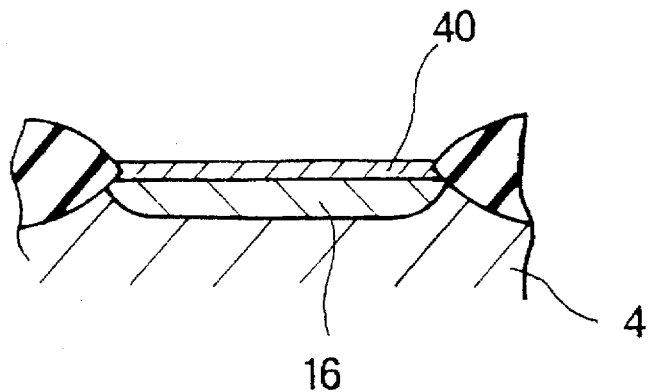
FIG. 10C is a schematic cross-sectional view of another process for the formation of a silicide layer on the surface of a diffusion layer.

Another process, as shown by FIG. 10A, is to directly form a silicide layer 40 on the surface of the polycrystalline silicon layer 12 or silicon semiconductor substrate 4 using CVD etc., then etching it so as to form the silicide layer 40 on the gate electrode as shown in FIG. 10B. In the same way, as shown in FIG. 10C, it is possible to directly form the silicide layer 40 on the diffusion layer 16 on the surface of the semiconductor substrate 4.

Figure 11A:
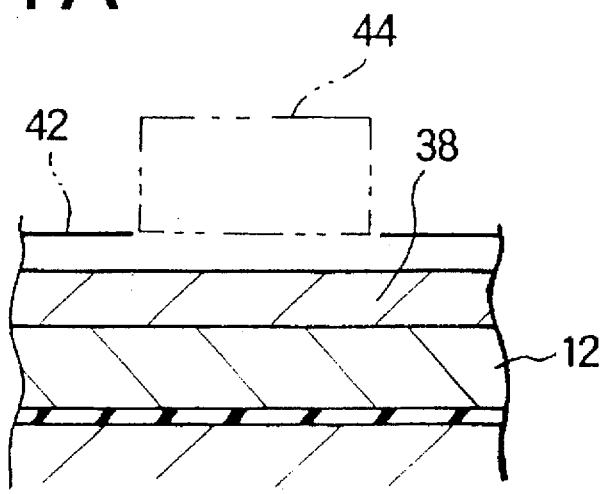
FIGS. 11A to 11C are schematic cross-sectional views of still another example of the formation of a silicide layer on a gate electrode.
Figure 11B:
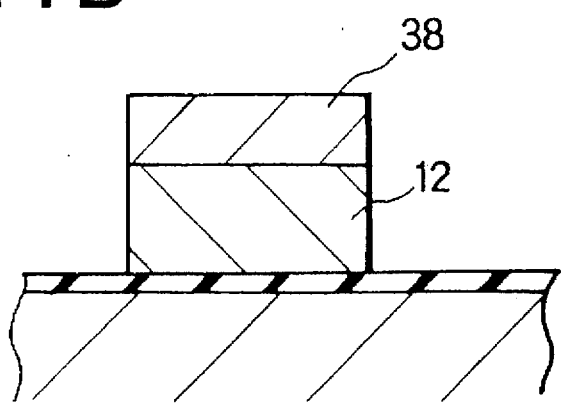
Figure 11C:
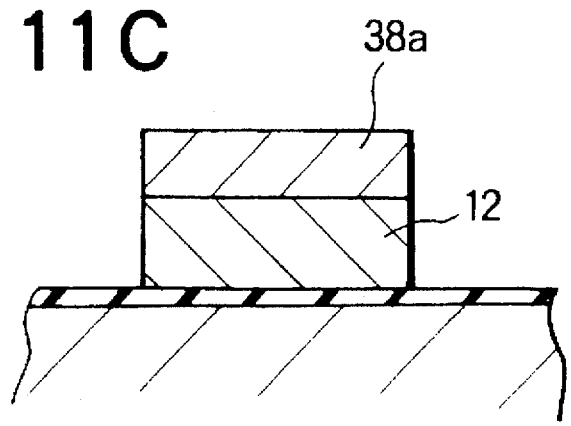

Still another process, as shown by FIG. 11A, is to form a metal layer 38 serving as the basis for the silicide layer on the polycrystalline silicon layer 12 by the CVD method etc., etch the polycrystalline silicon layer 12 and the metal layer 38, as shown by FIG. 11B, to the pattern of the gate electrode, then apply RTA, laser annealing, or other heat treatment to convert, as shown in FIG. 11C, the metal layer 38 contacting the polycrystalline silicon layer 12 to a silicide and therefore obtain the silicide layer 38a.

It is possible to reduce the standing wave effect at the time of photolithography for metals lowered in resistance on substrates by using the anti-reflection films explained below.

The process of the present invention enables the standing wave effect to be reduced and the variations in the width of interconnections to be suppressed when forming a pattern on the silicide metal on a gate electrode or diffusion layer.

Examples of the present invention are given below. The present invention is not, however, limited to these examples in any way.

Note that in the following description, the refractive index of the optical constants is expressed as n+ik and the explanation will be made referring to n and k.

EXAMPLE 1

In this example, as shown in FIG. 11A, a metal film 38 made of titanium is formed by CVD on the polycrystalline silicon film 12, then, as shown in FIG. 11B, the titanium metal film 38 and polycrystalline silicon film 12 are etched. Next, as shown in FIG. 11C, RTA treatment is performed to convert the titanium metal film 38 to a silicide and obtain the TiSi$_2$ silicide film 38a.

In this example, before the etching step shown in FIG. 11B, a resist pattern is formed on the titanium metal film 38 shown in FIG. 11A. In this construction, to reduce the standing wave effect, in this example, an inorganic anti-reflection film 42 such as of SiO$_x$N$_y$:H (SiO$_x$N$_y$ including hydrogen) or Si$_x$N$_y$:H (Si$_x$N$_y$ including hydrogen) is formed on the titanium metal film 38 and the resist film 44 is formed over that.

Figure 12:
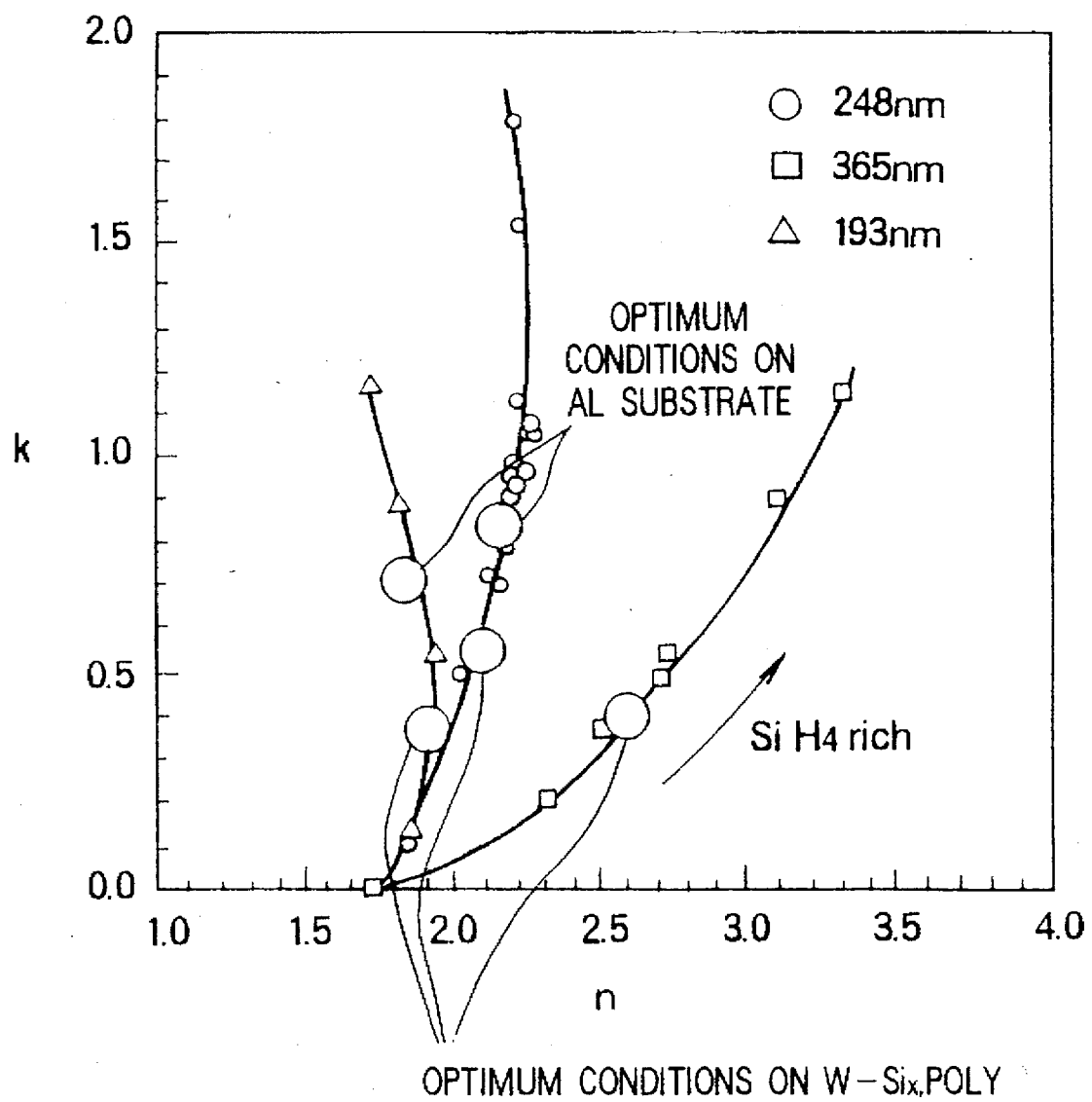
FIG. 12 is a graph of the changes in the n and k caused by conditions of the formation of an $SiO_xN_y$:H film as an anti-reflection film.

The SiO$_x$N$_y$:H is formed by the plasma CVD method using SiH$_4$, N$_2$O, N$_2$, NH$_3$, etc. Alternatively, it is formed using reactive sputtering. By changing the film-forming conditions of this method (in particular the ratio of flow of the SiH$_4$), it is possible to obtain an anti-reflection film which enables the k (imaginary portion of the refractive index) of the optical constants to be changed considerably with almost no change of the n (real portion of the refractive index) as shown in FIG. 12. In particular, it is possible to cause k to change over a wide range even with a wavelength of 248 nm.

Figure 1:
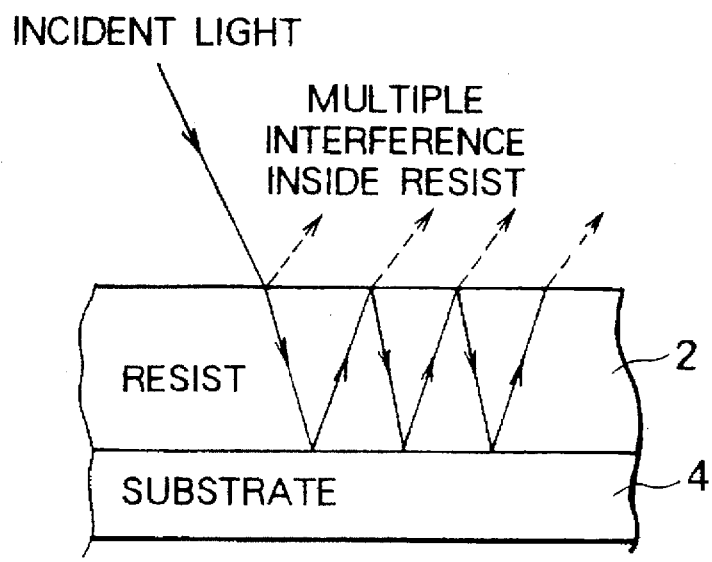
FIG. 1 is a schematic view of the standing wave effect.
Figure 2:
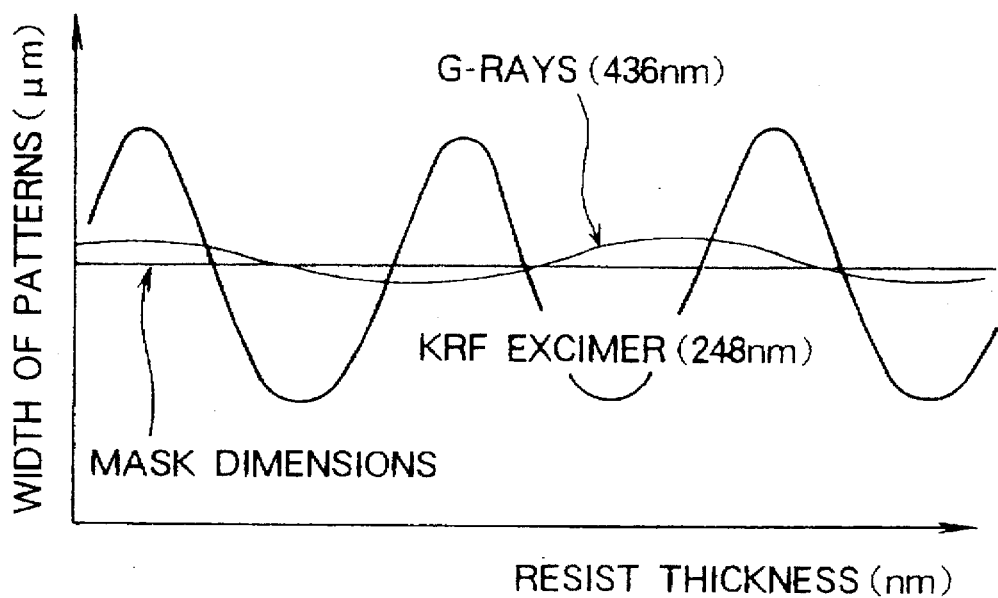
FIG. 2 is a graph showing the increase in the standing wave effect accompanying a reduction in the exposure wavelength.
Figure 3:
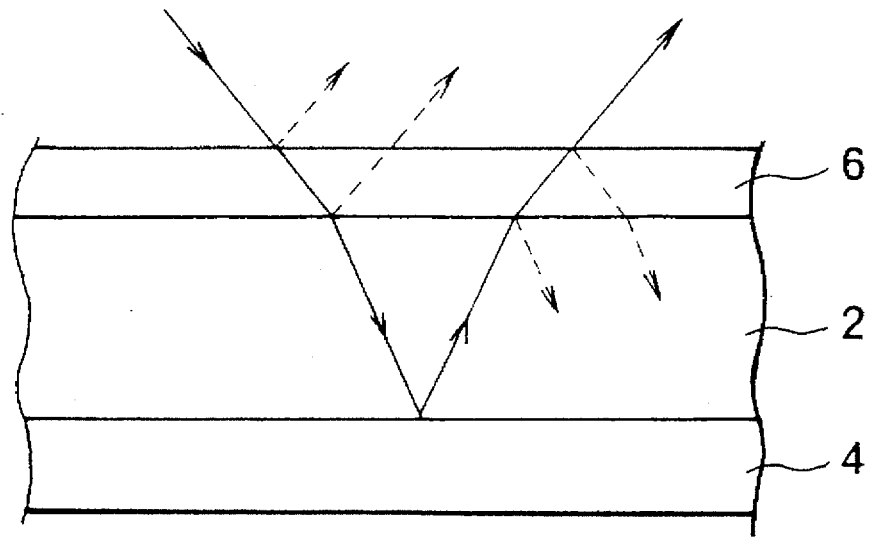
FIG. 3 is a view explaining an example of the anti-reflection technique used to reduce the standing wave effect.
Figure 4:
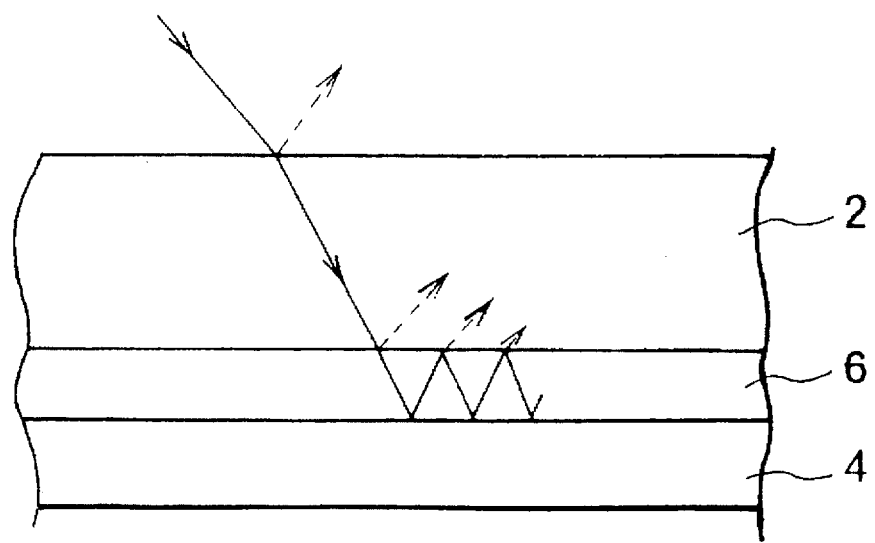
FIG. 4 is a view explaining another example of the anti-reflection technique used to reduce the standing wave effect.
Figure 5A:
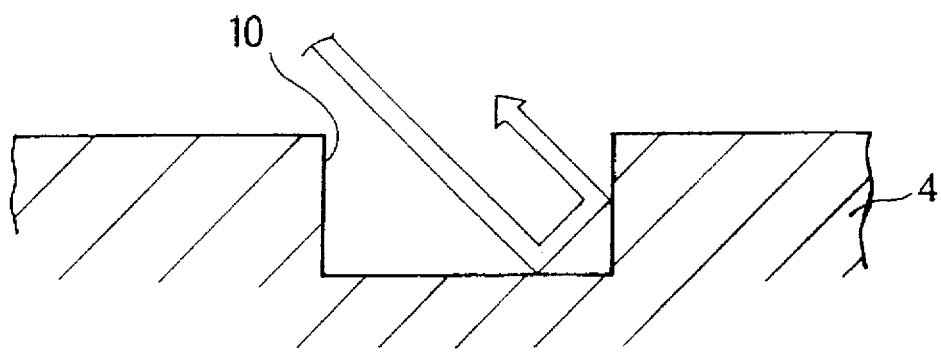
FIGS. 5A and 5B are schematic cross-sectional views of the anti-reflection technique for dealing with steps.
Figure 5B:
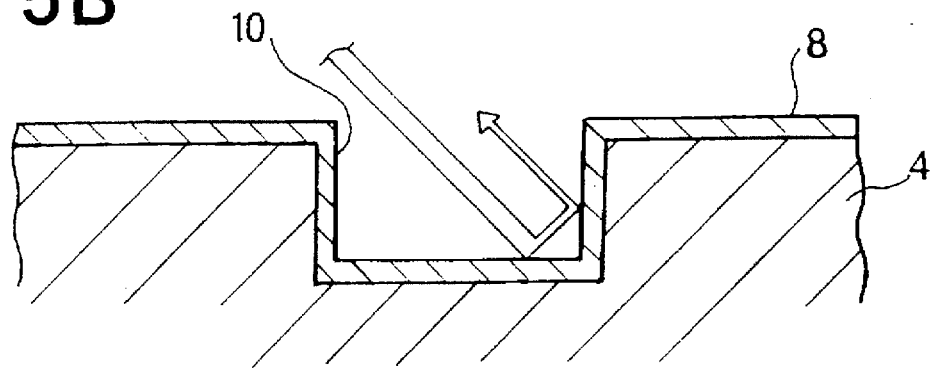
Figure 6:
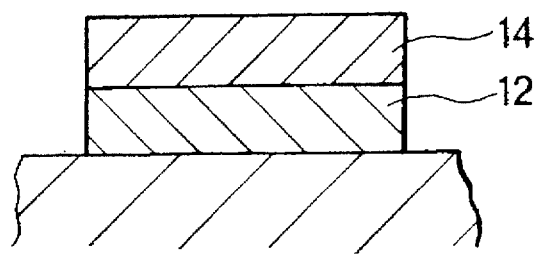
FIG. 6 is a cross-sectional view of an example of a gate electrode.
Figure 7:
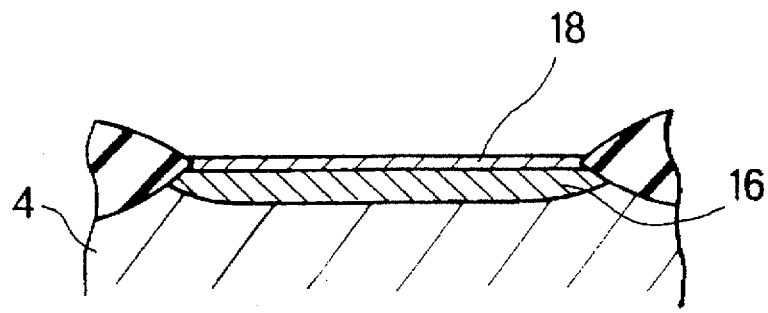
FIG. 7 is a cross-sectional view of key portions of a silicide layer used for reducing the resistance of a diffusion layer.

It is possible to reduce the standing wave effect shown in FIGS. 1 and 2 by using this property to change the k and thickness of the SiO$_x$N$_y$:H. In the same way, an Si$_x$N$_y$:H film formed using plasma CVD or reactive sputtering has a similar optical property.

Figure 13:
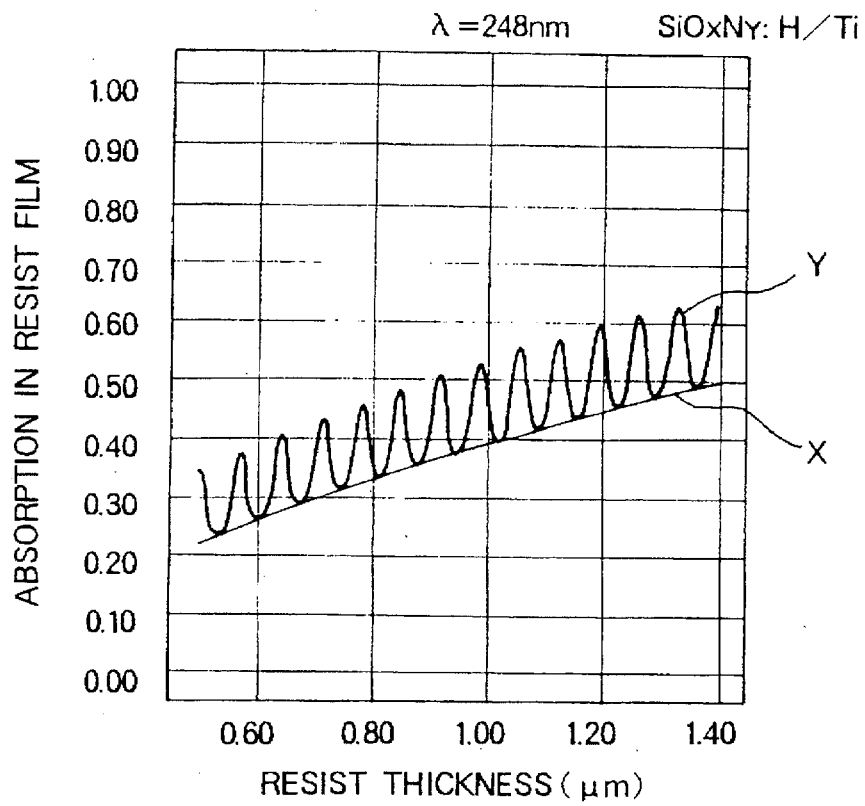
FIG. 13 is a graph showing the reduction of the standing wave effect in a first example of the present invention.

The results of reduction of the standing wave effect using the optimized SiO$_x$N$_y$:H film on the Ti metal film 38 are shown by the curve X in FIG. 13. These results were obtained under the conditions of optical constants of the SiO$_x$N$_y$:H used as the anti-reflection film 12 of n=2.1 and k=0.62 and a thickness of 23 nm. The optical constants of the titanium used at this time are n=1.175 and k=1.668 (wavelength of 248 nm). Note that in FIG. 13, the standing wave effect in the case of patterning the resist film by photolithography without using the SiO$_x$N$_y$:H film as the anti-reflection film 42 is shown by the curve Y.

Figure 14:
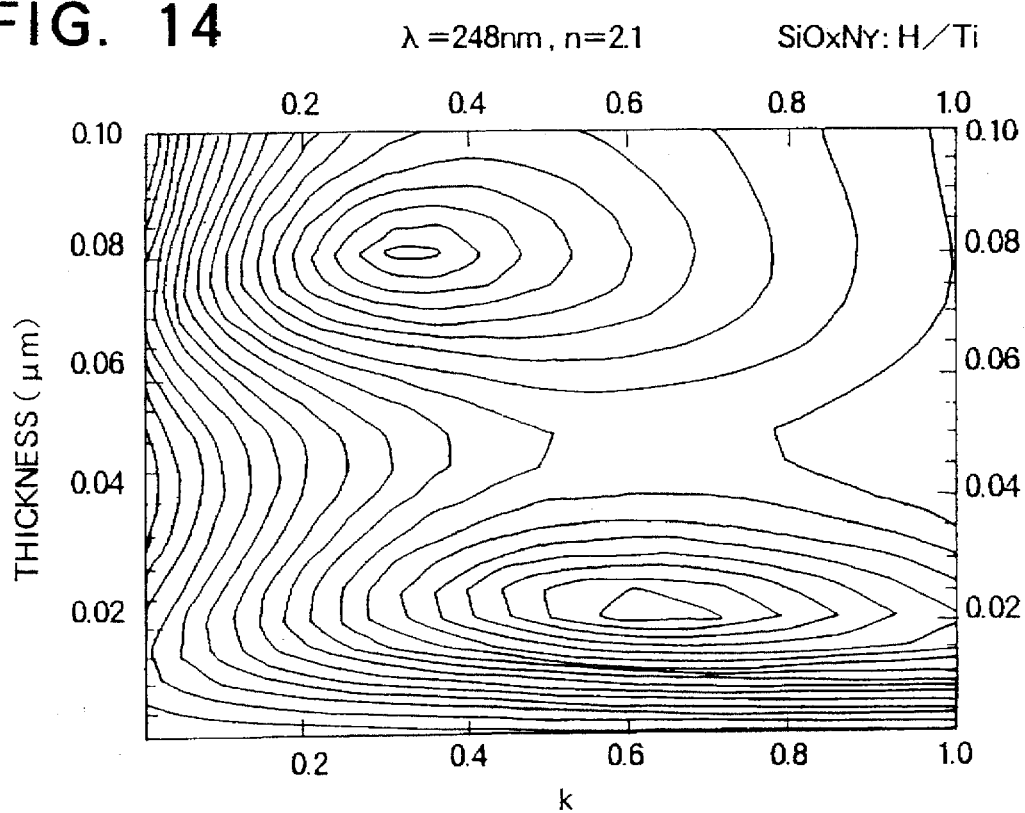
FIG. 14 is a graph of the results of the simulation of the standing wave effect in the case of changing the k and d of the anti-reflection film in the first example of the present invention.

FIG. 14 shows the results of the simulation of the standing wave effect by an SiO$_x$N$_y$:H film in the case of fixing the value of n (n=2.1, exposure wavelength of 248 nm). The horizontal axis shows the k of the SiO$_x$N$_y$:H film, while the vertical axis shows the thickness of the SiO$_x$N$_y$:H film. Further, each line indicates an increase of the standing wave effect by 1 percent. From this figure, it is learned that the optimal value (where the standing wave is made 0) is present at k=0.33 and a thickness (d) near 80 nm. From these results, it is found that to hold the amplitude of the standing wave below 7 percent, preferably below 3 percent, the optical constants and thickness (d) of the SiO$_x$N$_y$:H film should be set to n=2.1±0.2, k=0.5 to 0.8, and d=20 to 30 nm or n=2.1±0.2, k=0.25 to 0.4, and d=75 to 85 nm. By using an SiO$_x$N$_y$:H film of this range of settings as the anti-reflection film 42, it is possible to form a good pattern of the resist film 44 with no variation in the width of interconnections, halation, etc. on the titanium metal film 38 and, based on this, after etching and RTA, to obtain a pattern of the Ti—Si silicide film 38a having an excellent shape.

EXAMPLE 2

In this example, the same procedure was followed as the Example 1, except that a cobalt film was used as the metal film shown in FIG. 11A and Co—Si was used as the silicide metal obtained after RTA, to form a Co—Si silicide layer 38a such as shown in FIG. 11C.

The optical constants of cobalt at the exposure wavelength (248 nm) of KrF excimer laser lithography are n=1.22 and k=1.74.

Figure 15:
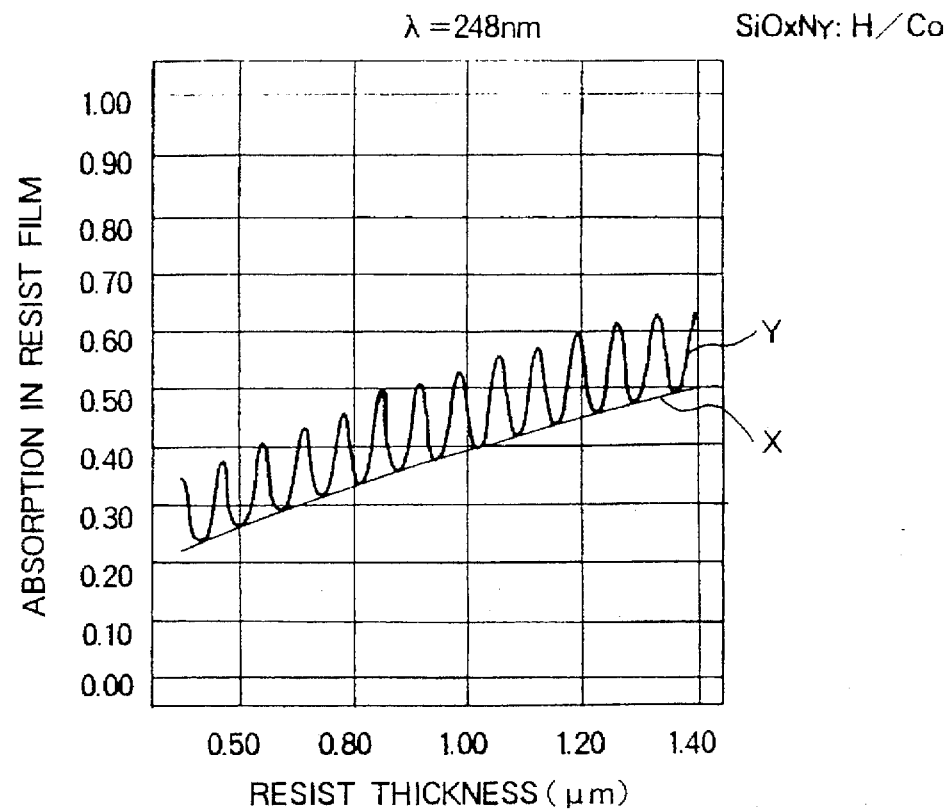
FIG. 15 is a graph showing the reduction of the standing wave effect in a second example of the present invention.

In this example, by forming an SiO$_x$N$_y$:H or Si$_x$N$_y$:H film optimized to reduce the standing wave effect on the cobalt metal film and performing the photolithography of the resist film on that, the variations in the width of interconnections on the gate, halation, etc. were reduced. The results of the optimization using the SiO$_x$N$_y$:H film are shown by the curve X in FIG. 15. These results were obtained under conditions of optical constants of the SiO$_x$N$_y$:H film of n=2.1 and k=0.61 and a thickness (d) of 23 nm. Note that in FIG. 15, the standing wave effect in the case of patterning the resist film by photolithography without using the SiO$_x$N$_y$:H film as the anti-reflection film 42 is shown by the curve Y.

Figure 16:
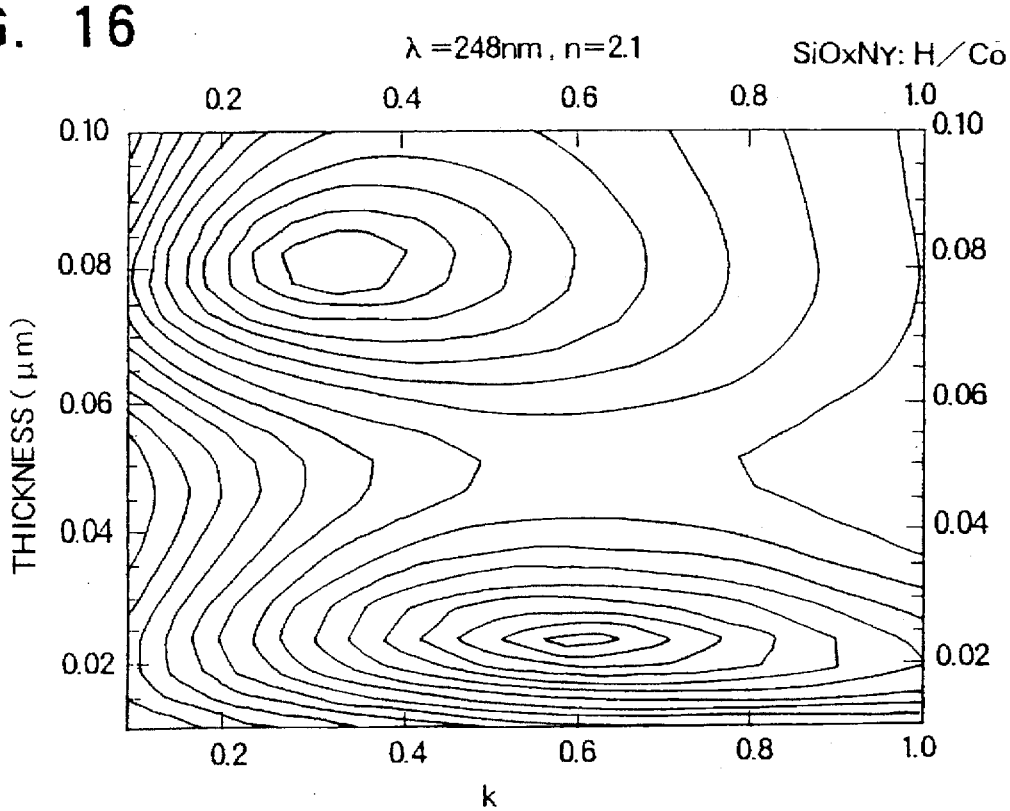
FIG. 16 is a graph of the results of the simulation of the standing wave effect in the case of changing the k and d of the anti-reflection film in the second example of the present invention.

FIG. 16 shows the results of the simulation of the standing wave effect by an SiO$_x$N$_y$:H film in the case of fixing the value of n to 2.1. The horizontal axis shows the k, while the vertical axis shows the thickness of the SiO$_x$N$_y$:H film. Further, each line indicates an increase of the standing wave effect by 1 percent. From this figure, it is learned that the optimal value where the standing wave is made 0 is present at k=0.33 and a thickness near 82.5 nm as well. From these results, it is found that to hold the amplitude of the standing wave below 3 percent, the optical constants and thickness (d) of the SiO$_x$N$_y$:H film should be set to n=2.1±0.2, k=0.5 to 0.7, and d=22 to 28 nm or n=2.1±0.2, k=0.25 to 0.4, and d=77 to 83 nm. By using an SiO$_x$N$_y$:H film of this range of settings as the anti-reflection film 42, it is possible to form a good pattern of the resist film 44 with no variation in the width of interconnections, halation, etc. on the cobalt metal film 38 and, based on this, after etching and RTA, to obtain a pattern of the Co—Si silicide film 38a having an excellent shape.

EXAMPLE 3

In this example, the same procedure was followed as the Example 1, except that a platinum film was used as the metal film shown in FIG. 11A and Pt—Si was used as the silicide metal obtained after RTA, to form a Pt—Si silicide layer 38a such as shown in FIG. 11C.

The optical constants of platinum at the exposure wavelength (248 nm) of KrF excimer laser lithography are n=1.37 and k=1.76.

Figure 17:
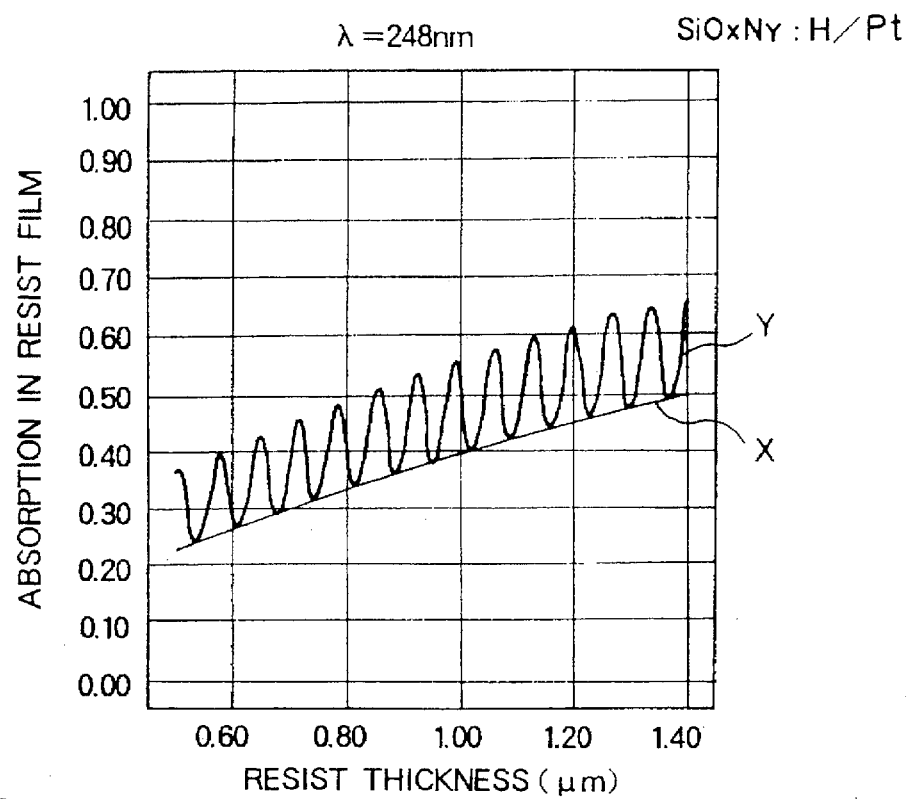
FIG. 17 is a graph showing the reduction of the standing wave effect in a third example of the present invention.

In this example, by forming an SiO$_x$N$_y$:H or Si$_x$N$_y$:H film optimized to reduce the standing wave effect on the Pt metal film and patterning the resist film by photolithography on that, the variation in the width of interconnections on the gate, halation, etc. were reduced. The results of the optimization using the SiO$_x$N$_y$:H film are shown by the curve X in FIG. 17. These results were obtained under conditions of optical constants of the SiO$_x$N$_y$:H film of n=2.1 and k=0.58 and a thickness (d) of 24 nm (results of exposure wavelength of 248 nm). Note that in FIG. 17, the standing wave effect in the case of patterning the resist film by photolithography without using the SiO$_x$N$_y$:H film as the anti-reflection film 42 is shown by the curve Y.

Figure 18:
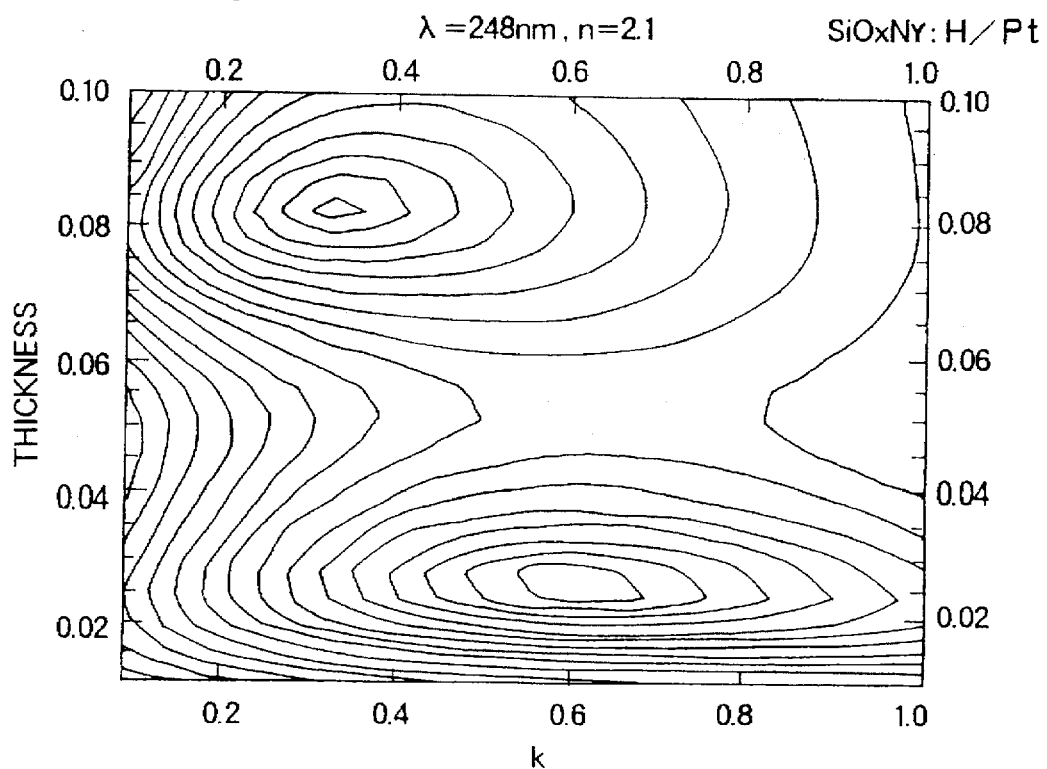
FIG. 18 is graph of the results of the simulation of the standing wave effect in the case of changing the k and d of the anti-reflection film in the third example of the present invention.

FIG. 18 shows the results of the simulation of the standing wave effect by an SiO$_x$N$_y$:H film in the case of fixing the value of n to 2.1. The horizontal axis shows the k, while the vertical axis shows the thickness of the SiO$_x$N$_y$:H film. Further, each line indicates an increase of the standing wave effect by 1 percent. From this figure, it is learned that the optimal value where the standing wave is made 0 is present at k=0.32 and a thickness near 82.5 nm as well. From these results, it is found that to hold the amplitude of the standing wave below 3 percent, the optical constants and thickness (d) of the $SiO_xN_y$:H film should be set to n=2.1±0.2, k=0.5 to 0.7, and d=22 to 28 nm or n=2.1±0.2, k=0.22 to 0.4, and d=75 to 87 nm. By using an $SiO_xN_y$:H film of this range of settings as the anti-reflection film 42, it is possible to form a good pattern of the resist film 44 with no variation in the width of interconnections, halation, etc. on the platinum metal film 38 and, based on this, after etching and RTA, to obtain a pattern of the Pt—Si silicide film 38a having an excellent shape.

EXAMPLE 4

In this example, the same procedure was followed as the Example 1, except that a nickel film was used as the metal film shown in FIG. 11A and Ni—Si was used as the silicide metal obtained after RTA, to form an Ni—Si silicide layer 38a such as shown in FIG. 11C.

The optical constants of nickel at the exposure wavelength (248 nm) of KrF excimer laser lithography are n=1.40 and k=2.09.

Figure 19:
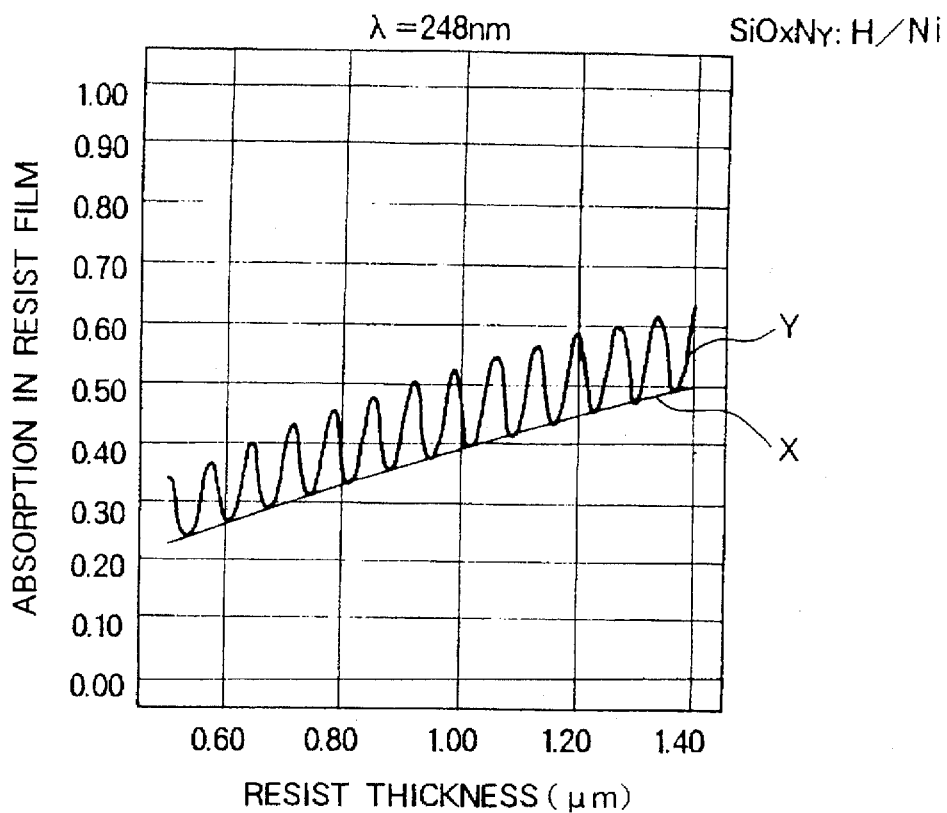
FIG. 19 is a graph showing the reduction of the standing wave effect in a fourth example of the present invention.

In this example, by forming an $SiO_xN_y$:H or $Si_xN_y$:H film optimized to reduce the standing wave effect on the Ni metal film and patterning the resist film by photolithography on that, the variation in the width of interconnections on the gate, halation, etc. were reduced. The results of the optimization using the $SiO_xN_y$:H film are shown by the curve X in FIG. 19. These results were obtained under conditions of optical constants of the $SiO_xN_y$:H film of n=2.1 and k=0.61 and a thickness (d) of 26 nm (exposure wavelength=248 nm). Note that in FIG. 19, the standing wave effect in the case of patterning the resist film by photolithography without using the $SiO_xN_y$:H film as the anti-reflection film 42 is shown by the curve Y.

Figure 20:
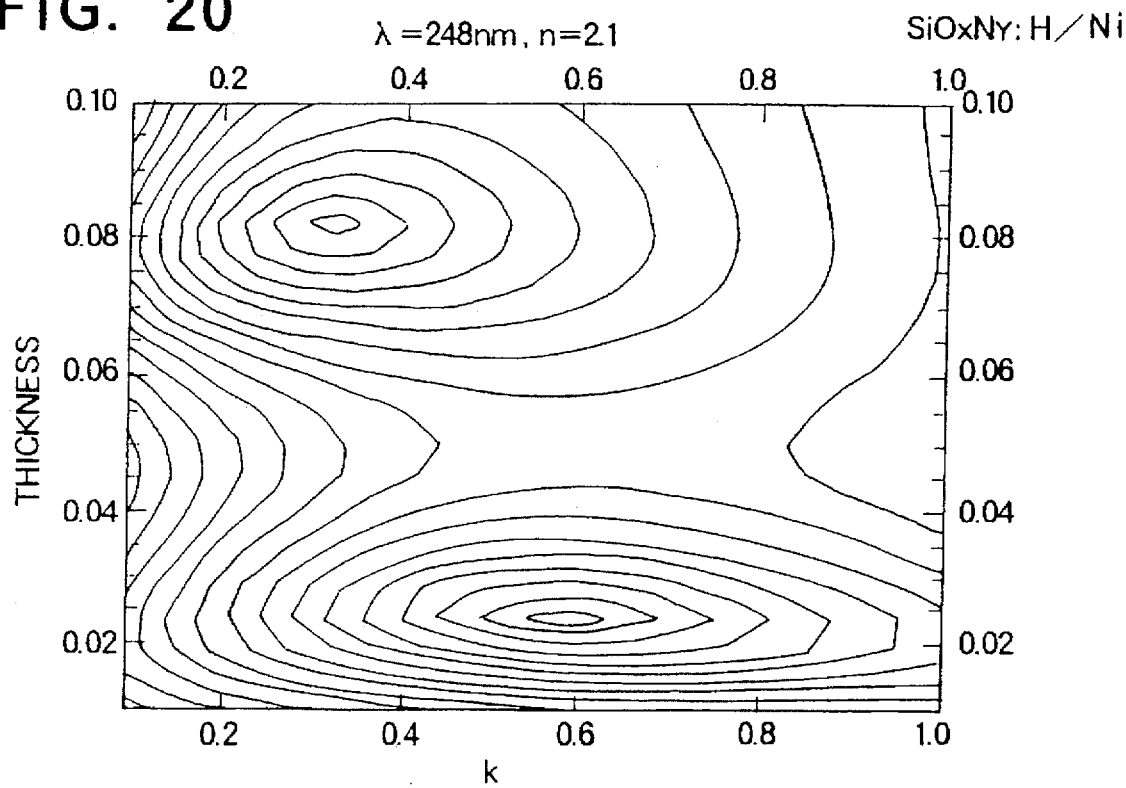
FIG. 20 is a graph of the results of the simulation of the standing wave effect in the case of changing the k and d of the anti-reflection film in the fourth example of the present invention.

FIG. 20 shows the results of the simulation of the standing wave effect by an $SiO_xN_y$:H film in the case of fixing the n value of the optical constants to 2.1. The horizontal axis shows the k, while the vertical axis shows the thickness of the $SiO_xN_y$:H film. Further, each line indicates an increase of the standing wave effect by 1. percent. From this figure, it is learned that the optimal value where the standing wave is made 0 is present at k=0.325 and a thickness near 82 nm. From these results, it is found that to hold the amplitude of the standing wave below 3 percent, the optical constant and thickness (d) of the $SiO_xN_y$:H film should be set to n=2.1±0.2, k=0.48 to 0.75, and d=22 to 30 nm or n=2.1±0.2, k=0.25 to 0.4, and d=77.5 to 88 nm. By using an $SiO_xN_y$:H film of this range of settings as the anti-reflection film 42, it is possible to form a good pattern of the resist film 44 with no variations in the width of interconnections, halation, etc. on the nickel metal film 38 and, based on this, after etching and RTA, to obtain a pattern of the Ni—Si silicide film 38a having an excellent shape.

EXAMPLE 5

In this example, an anti-reflection film and resist film were formed on a Ti—Si film serving as the silicide film and then photolithography was performed. The Ti—Si film was formed by forming a titanium film on the surface of a polycrystalline silicon film or monocrystalline silicon semiconductor substrate then performing RTA to convert this to a silicide or formed by the CVD method (see FIGS. 9A to 9C and FIGS. 10A to 10C).

In this example, the resist film was patterned by photolithography on the Ti—Si film formed in this way, then the resist film was used as a mask for etching so as to form an excellent Ti—Si pattern.

In this example, further, the optimized $SiO_xN_y$:H or $Si_xN_y$:H film was formed on the Ti—Si, then a resist film was formed over it, thereby reducing the standing wave effect at the time of photolithography of the resist film and reducing the variation in width of interconnections and differences in contact dimensions on the gate electrode and diffusion layer. The optical constants of Ti—Si at the exposure wavelength 248 nm in KrF excimer laser lithography are n=0.717 and k=1.878.

Figure 21:
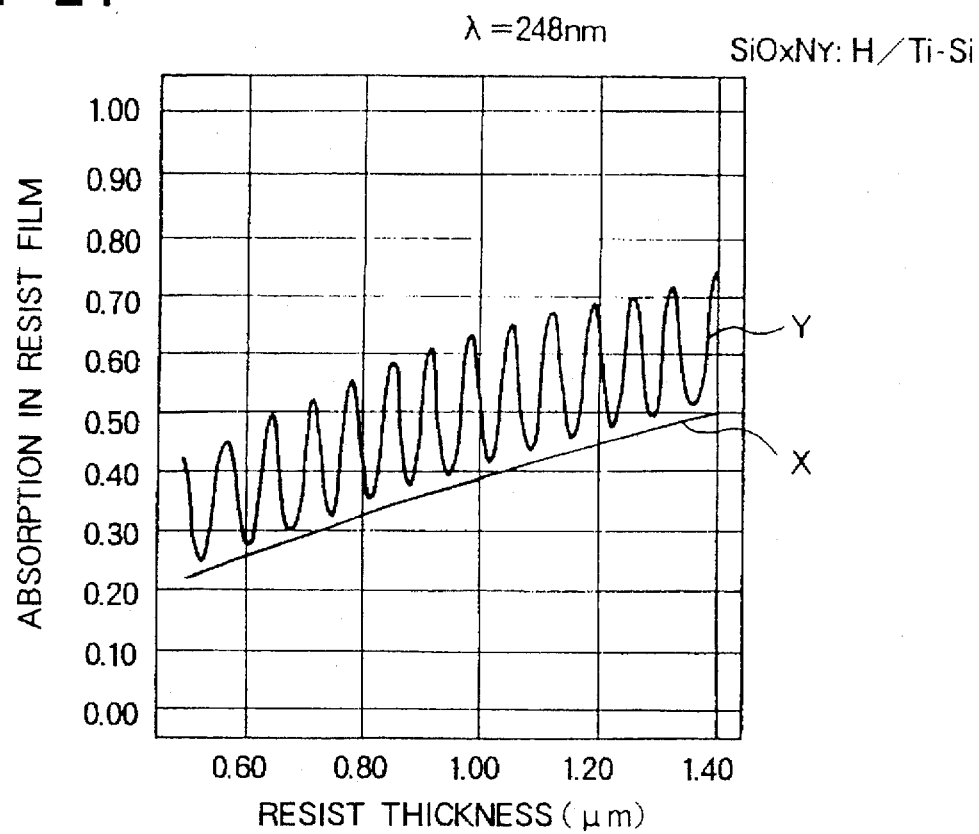
FIG. 21 is a graph showing the reduction of the standing wave effect in a fifth example of the present invention.

The results of optimization using $SiO_xN_y$:H on a Ti—Si substrate in KrF excimer laser lithography are shown by the curve X in FIG. 21. These results were obtained under conditions of optical constants and thickness (d) of the $SiO_xN_y$:H film of n=2.1 k=0.74, and d=23 nm. Note that in FIG. 21, the standing wave effect in the case of patterning the resist film by photolithography without using the $SiO_xN_y$:H film as the anti-reflection film is shown by the curve Y.

Figure 22:
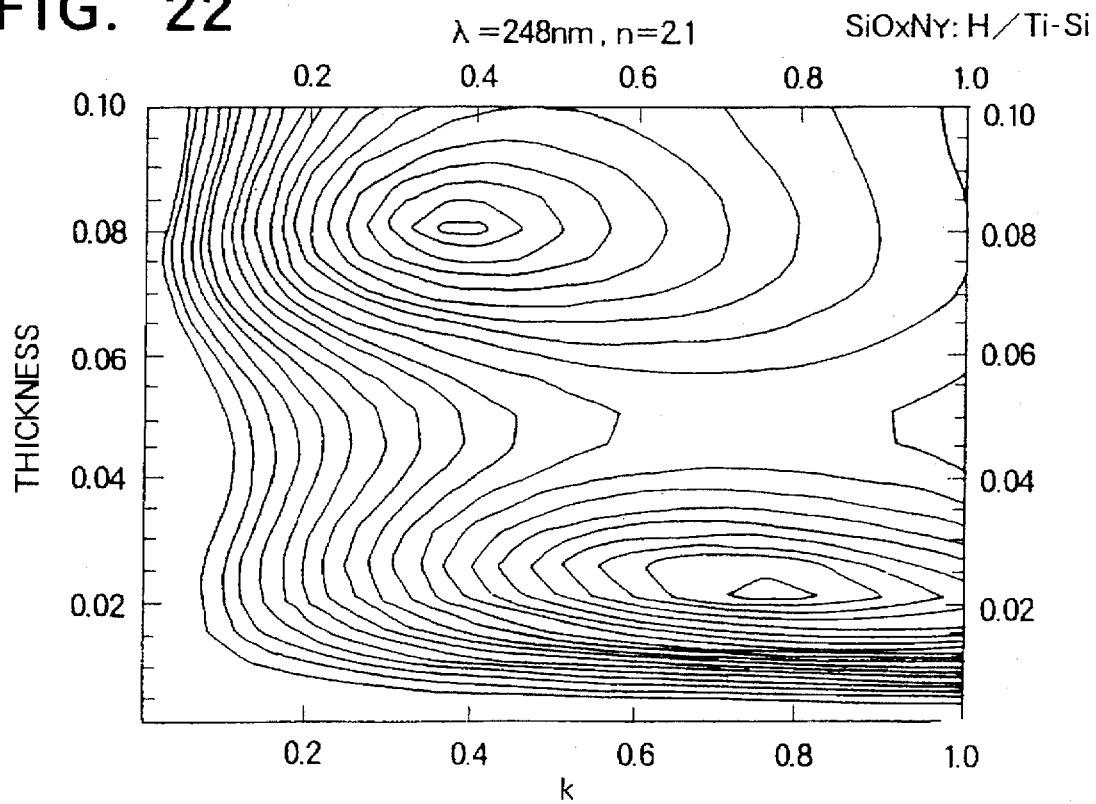
FIG. 22 is a graph of the results of the simulation of the standing wave effect in the case of changing the k and d of the anti-reflection film in the fifth example of the present invention.

FIG. 22 shows the results of the simulation of the standing wave effect by an $SiO_xN_y$:H film in the case of fixing the n value of the optical constants to 2.1. The horizontal axis shows the k of the $SiO_xN_y$:H film, while the vertical axis shows the thickness of the $SiO_xN_y$:H film. Further, each line indicates an increase of the standing wave effect by 1 percent. From this figure, it is learned that the optimal value where the standing wave is made 0 is present at k=0.375 and a thickness near 80 nm as well. From these results, it is found that to hold the amplitude of the standing wave below 3 percent, the optical constants and thickness d of the $SiO_xN_y$:H film should be set to n=2.1±0.2, k=0.6 to 0.95, and d=18 to 27 nm or n=2.1±0.2, k=0.32 to 0.45, and d=75 to 85 nm. By this, it is possible to form on the Ti—Si film a pattern of the resist film with little variations in the width of interconnections, halation, changes in the contact diameter, etc. and, after etching, to obtain a pattern of the Ti—Si having an excellent shape.

EXAMPLE 6

The same procedure was follows as in Example 5, except for using a silicide metal lower in resistance than even the resistance of W—Si, such as Co—Si, Pt—Si, or Ni—Si, instead of the TiSi, to pattern a silicide metal.

In the same way as the case of Ti—Si, when using an $SiO_xN_y$:H film having an n of 2.1±0.2 as the anti-reflection film, there is a region where the standing wave can be made 0 in the range of k=0.5±0.5 and d=25±15 nm, or k=0.85±0.5 and d=80±15 nm. It is therefore possible to form a pattern on a silicide metal with little variation in width of interconnections, halation, changes in contact diameters, etc. and, after etching, to obtain a pattern of a silicide metal having a good shape.

EXAMPLE 7

Figure 23A:
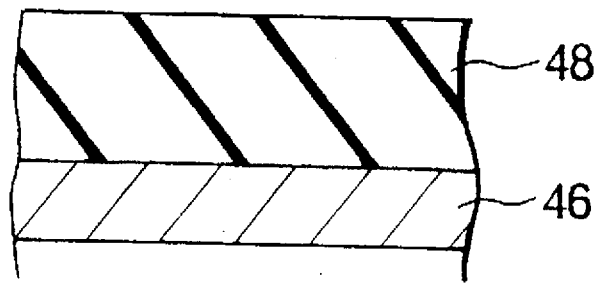
FIGS. 23A and 23B are schematic cross-sectional views of the position of the formation of the anti-reflection film used in a seventh example of the present invention.
Figure 23B:
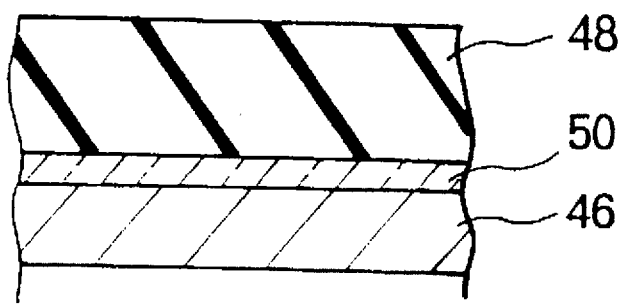

In a construction such as of a gate electrode where, as shown in FIG. 23A, an interlayer film 48 such as an offset oxide film comprised of $SiO_2$ etc. is formed on a silicide film 46 comprised of a Ti—Si film, as shown in FIG. 23B, an $SiO_xN_y$:H or $Si_xN_y$:H film was formed by the CVD method, sputtering method, or reactive sputtering method between the silicide metal 46 and the interlayer film 48 as an anti-reflection film 50.

The optical constants of $SiO_2$ in the case of using an oxide film as the interlayer film 48 in KrF excimer laser lithography (wavelength 248 nm) are n=1.52 and k=0.

Figure 24:
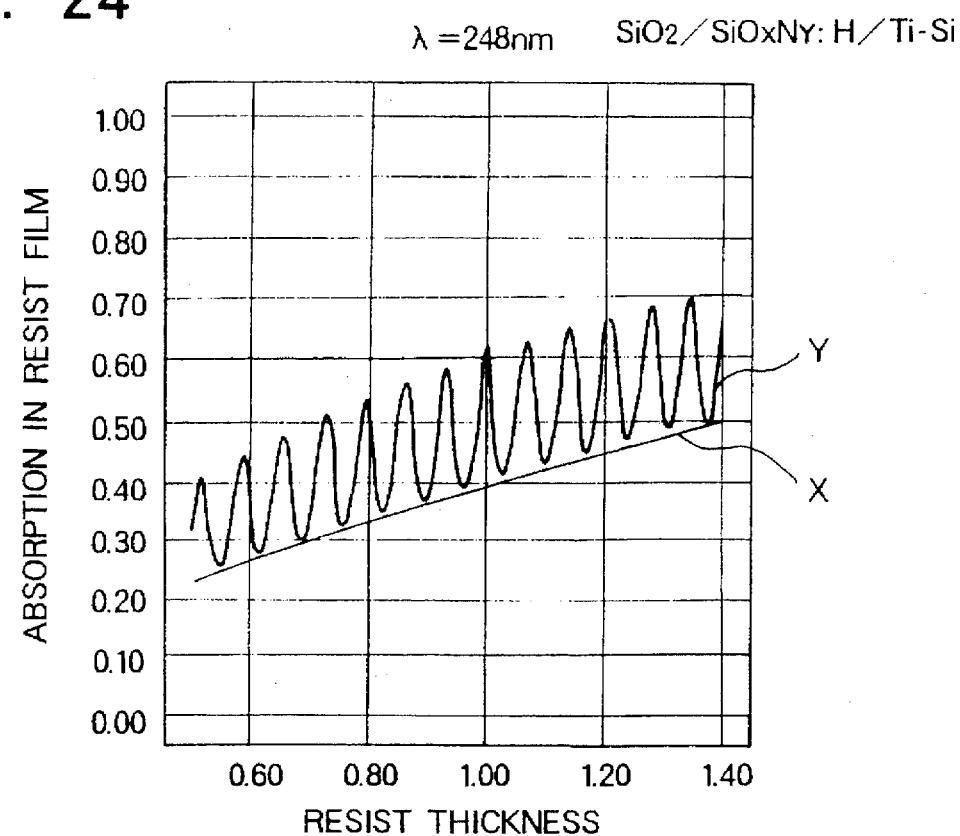
FIG. 24 is a graph showing the reduction of the standing wave effect in the seventh example of the present invention.

The results of optimization are shown by the curve X in FIG. 24. These results were obtained under conditions of optical constants and thickness d of the $SiO_xN_y$:H film used as the anti-reflection film 50 of n=2.1, k=0.84, and d=19 nm. Note that in FIG. 24, the standing wave effect in the case of patterning the resist film by photolithography without using the $SiO_xN_y$:H film as the anti-reflection film is shown by the curve Y.

Figure 25:
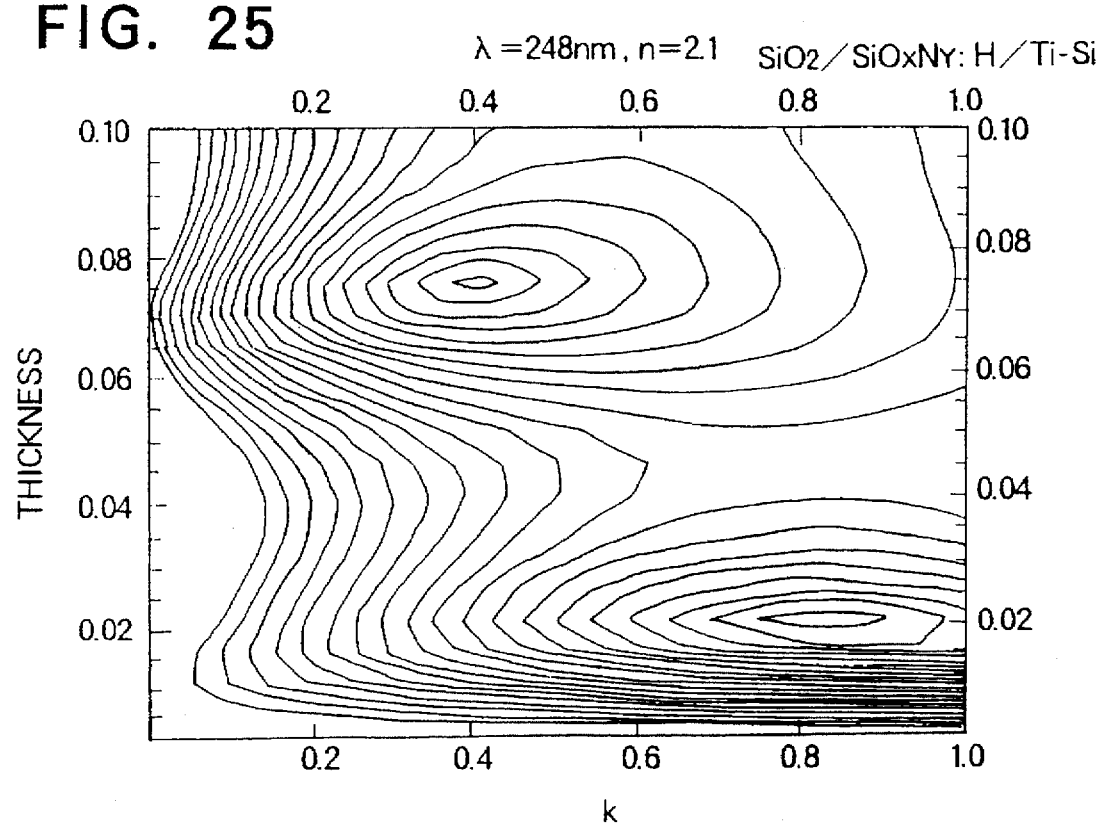
FIG. 25 is a graph of the results of the simulation of the standing wave effect in the case of changing the k and d of the anti-reflection film in the seventh example of the present invention.

FIG. 25 shows the results of the simulation of the standing wave effect by an $SiO_xN_y$:H film in the case of fixing the n value of the optical constants of the $SiO_xN_y$:H film to 2.1. The horizontal axis shows the thickness of the $SiO_xN_y$:H film, while the vertical axis shows the k. Further, each line indicates an increase of the standing wave effect by 1 percent. From this figure, it is learned that the optimal value where the standing wave is made 0 is present at k=0.4 and a thickness near 75 nm as well. From these results, it is found that to hold the amplitude of the standing wave below 3 percent, the optical constants and thickness d of the $SiO_x$-$N_y$:H film should be set to n=2.1±0.2, k=0.7 to 0.95, and d=15 to 25 nm or n=2.1±0.2, k=0.32 to 0.47, and d=70 to 78 nm. By this, in a structure with an $SiO_xN_y$:H anti-reflection film 50 formed on a Ti—Si silicide layer 46 and an interlayer film 48 formed on top of that, it is possible to form a pattern with little variation in the width of interconnections, halation, etc. when patterning the resist and, after etching, to obtain a pattern of the Ti—Si having an excellent shape.

EXAMPLE 8

The same procedure was follows as in Example 7, except for using a silicide metal lower in resistance than even the resistance of W—Si, such as Co—Si, Pt—Si, or Ni—Si, instead of the Ti—Si, to pattern a silicide film having an interlayer film.

As the anti-reflection film 50, an $SiO_xN_y$:H or $Si_xN_y$:H film was formed by CVD or reactive sputtering.

In the same way as the case of Ti—Si, when using an $SiO_xN_y$:H film having an n of 2.1±0.2, there is a region where the standing wave can be made 0 in the range of k=0.5±0.5 and d=25±15 nm and k=0.85±0.5 and d=80±15 nm. It is therefore possible to form a pattern on a silicide metal with little variation in width of interconnections, halation, etc. and, after etching, to obtain a pattern of a silicide metal having a good shape.

EXAMPLE 9

Figure 26A:
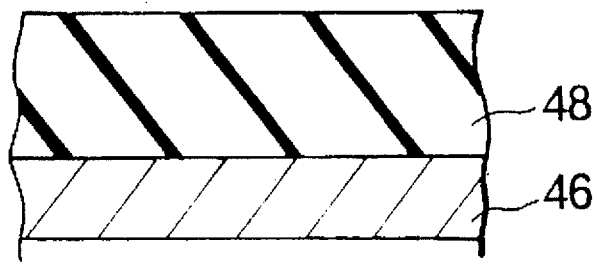
Figure 26B:
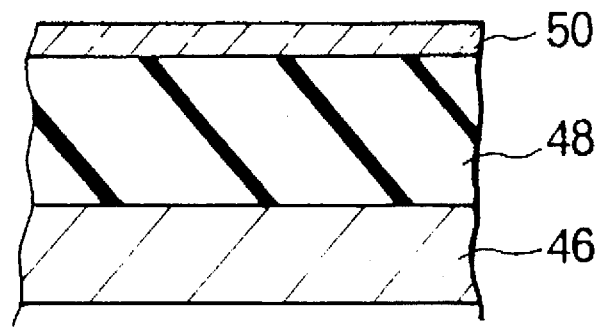

In a construction such as of a gate electrode where, as shown in FIG. 26A, an interlayer film 48 such as an offset oxide film comprised of $SiO_2$ etc is formed on a silicide film 46 comprised of a Ti—Si film, as shown in FIG. 26B, an $SiO_xN_y$:H or $Si_xN_y$:H film was formed by the CVD method, sputtering method, or reactive sputtering method on the interlayer film 48 as an anti-reflection film 50.

The optical constants of $SiO_2$ in the case of using an oxide film as the interlayer film 48 in KrF excimer laser lithography (wavelength 248 nm) are n=1.52 and k=0.

Figure 27:
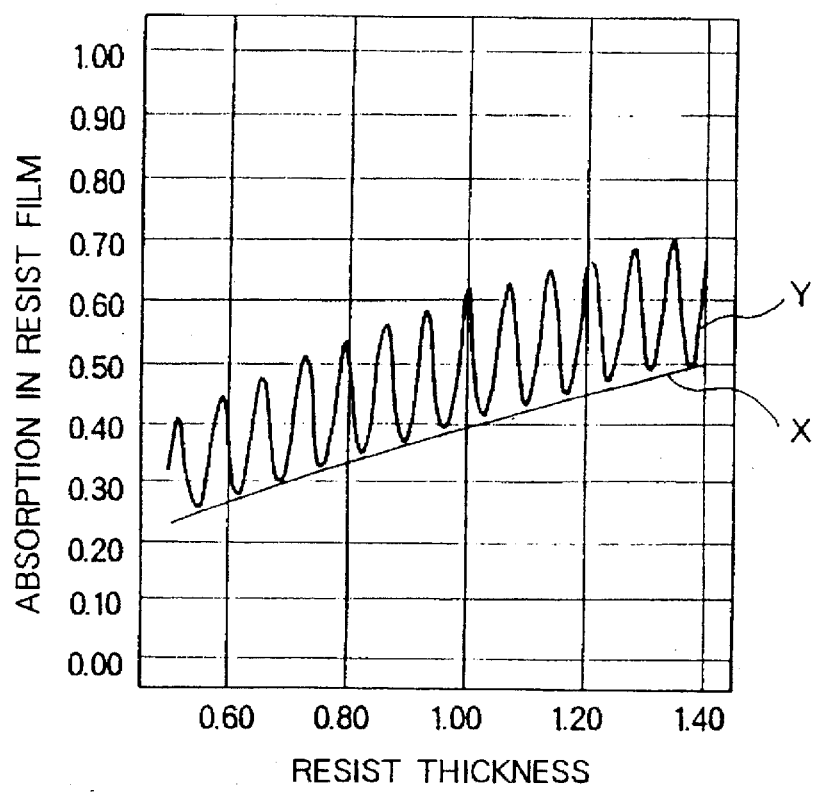
FIG. 27 is a graph showing the reduction of the standing wave effect in the ninth example of the present invention.

The results of optimization are shown by the curve X in FIG. 27. These results were obtained under conditions of optical constants and thickness d of the $SiO_xN_y$:H film of n=2.1, k=0.62, and d=36 nm. Note that in FIG. 27, the standing wave effect in the case of patterning the resist film by photolithography without using the $SiO_xN_y$:H film as the anti-reflection film is shown by the curve Y.

Figure 28:
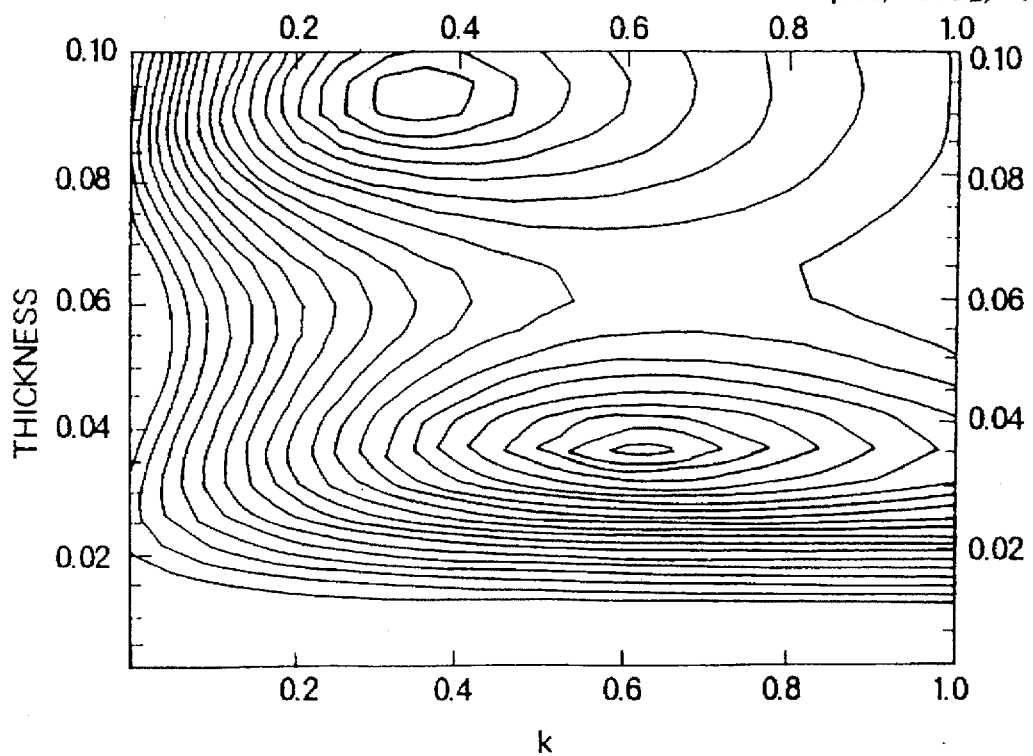
FIG. 28 is a graph of the results of the simulation of the standing wave effect in the case of changing the k and d of the anti-reflection film in the ninth example of the present invention.

FIG. 28 shows the results of the simulation of the standing wave effect by an $SiO_xN_y$:H film in the case of fixing the n value of the optical constants of the $SiO_xN_y$:H film to 2.1 and changing k and d. The horizontal axis shows the thickness of the $SiO_xN_y$:H film, while the vertical axis shows the k. Further, each line indicates an increase of the standing wave effect by 1 percent. From this figure, it is learned that the optimal value where the standing wave is made 0 is present near k=0.35 and a thickness of 95 nm as well. From these results, it is found that to hold the amplitude of the standing wave below 3 percent, the optical constants and thickness d of the $SiO_xN_y$:H film should be set to n=2.1±0.2, k=0.5 to 0.7, and d=33 to 38 nm or n=2.1±0.2, k=0.25 to 0.53, and d=86 to 110 nm. By this, in a structure with an interlayer film 48 formed on the Ti—Si silicide film 46 and an $SiO_xN_y$:H anti-reflection film 50 formed on top of that, it is possible to form a pattern with little variation in the width of interconnections, halation, etc. when patterning the resist and, after etching, to obtain a pattern of the Ti—Si having an excellent shape.

EXAMPLE 10

The same procedure was follows as in Example 9, except for using a silicide metal lower in resistance than even the resistance of W—Si, such as Co—Si, Pt—Si, or Ni—Si, instead of the TiSi, to pattern a silicide film having an interlayer film.

As the anti-reflection film 50, an $SiO_xN_y$:H or $Si_xN_y$:H film was formed by CVD or reactive sputtering.

In the same way as the case of Ti—Si, when using an $SiO_xN_y$:H film having an n of 2.1±0.2, there is a region where the standing wave can be made 0 in the range of k=0.5±0.5 and d=25±15 nm or k=0.85±0.5 and d=80±15 nm. It is therefore possible to form a pattern on a silicide metal with little variation in width of interconnections, halation, etc. and, after etching, to obtain a pattern of a silicide metal having a good shape.

EXAMPLE 11

Figure 8:
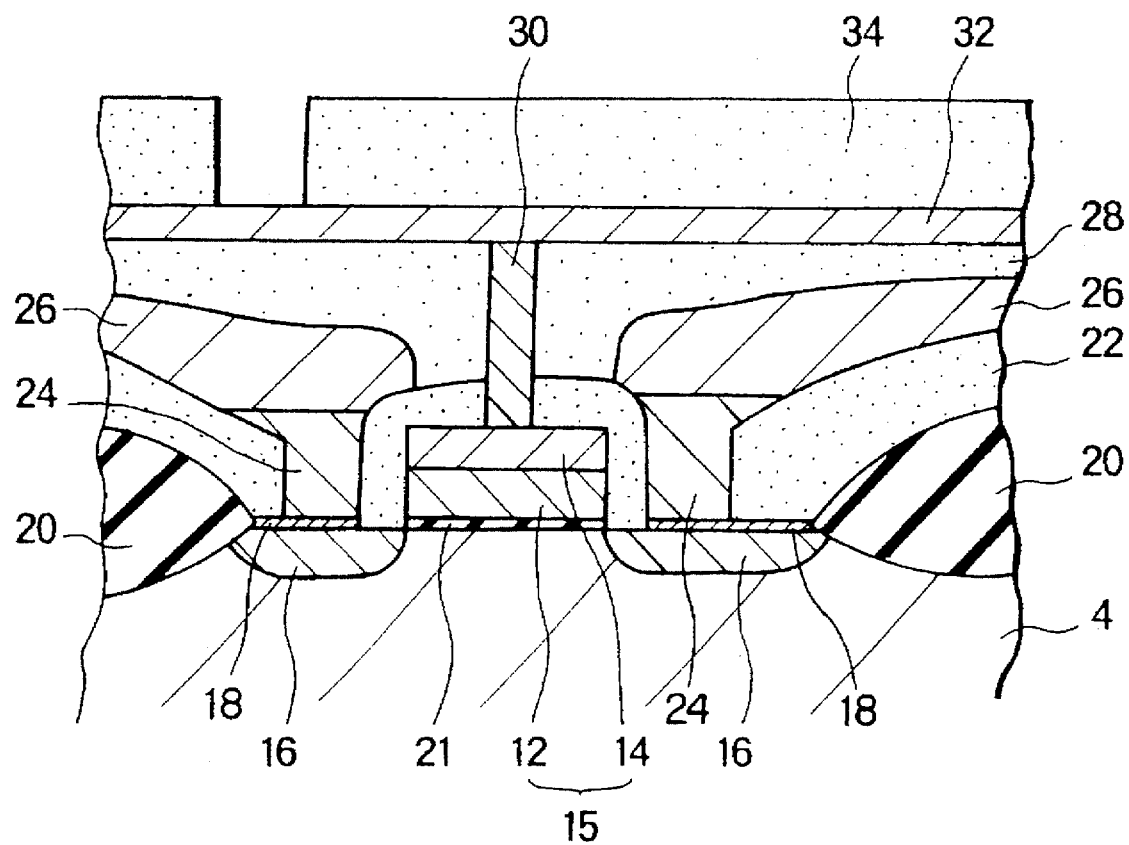
FIG. 8 is a schematic cross-sectional view of key portions of a semiconductor device to which the process according to an embodiment of the present invention is applied.

Along with the miniaturization of patterns, interconnection materials resistant to breakage become required in fine patterns as well. Tungsten may be considered as one of these materials. Tungsten is used for example in the tungsten bracket 24 or tungsten layer 32 shown in FIG. 8.

To prevent variations in the width of interconnections and keep the contact holes uniform when patterning a resist on tungsten, use is made of an $SiO_xN_y$:H film or an $Si_xN_y$:H film as an anti-reflection film.

The optical constants of tungsten are n=3.37 and k=2.87 at a 248 nm exposure wavelength of KrF excimer laser lithography and are n=0.93 and k=1.02 at the 193 exposure wavelength of ArF excimer laser lithography, which may be used for further miniaturization.

Figure 29:
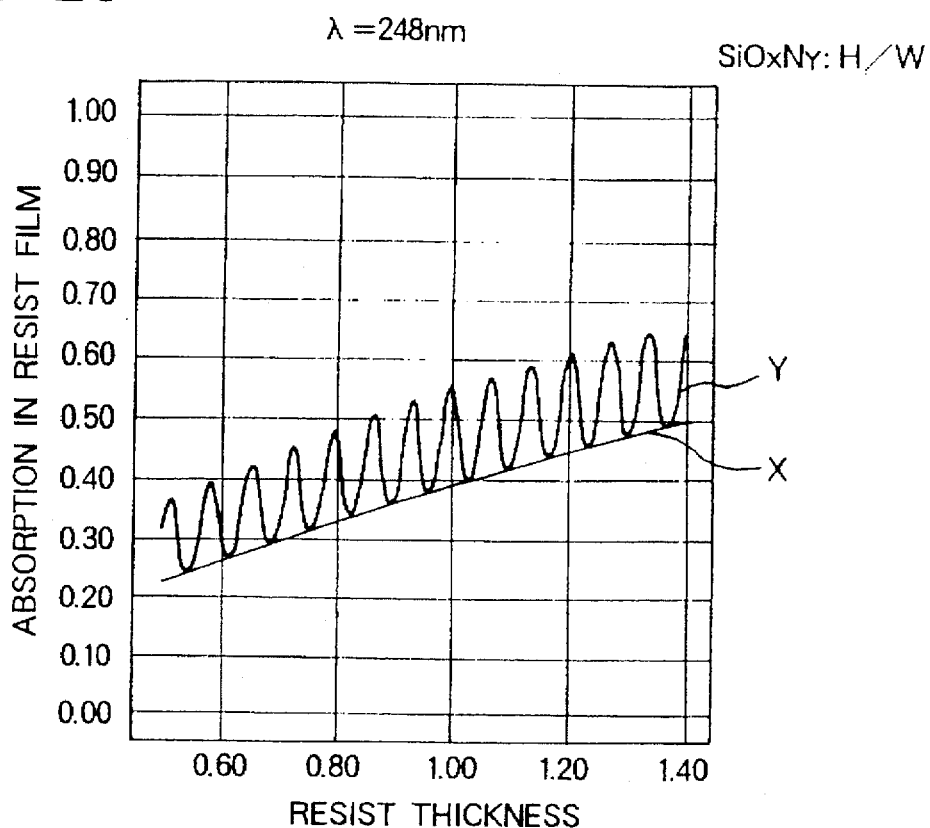
FIG. 29 is a graph of the reduction of the standing wave effect in an 11th example of the present invention (wavelength $\gamma=248$ nm)
Figure 30:
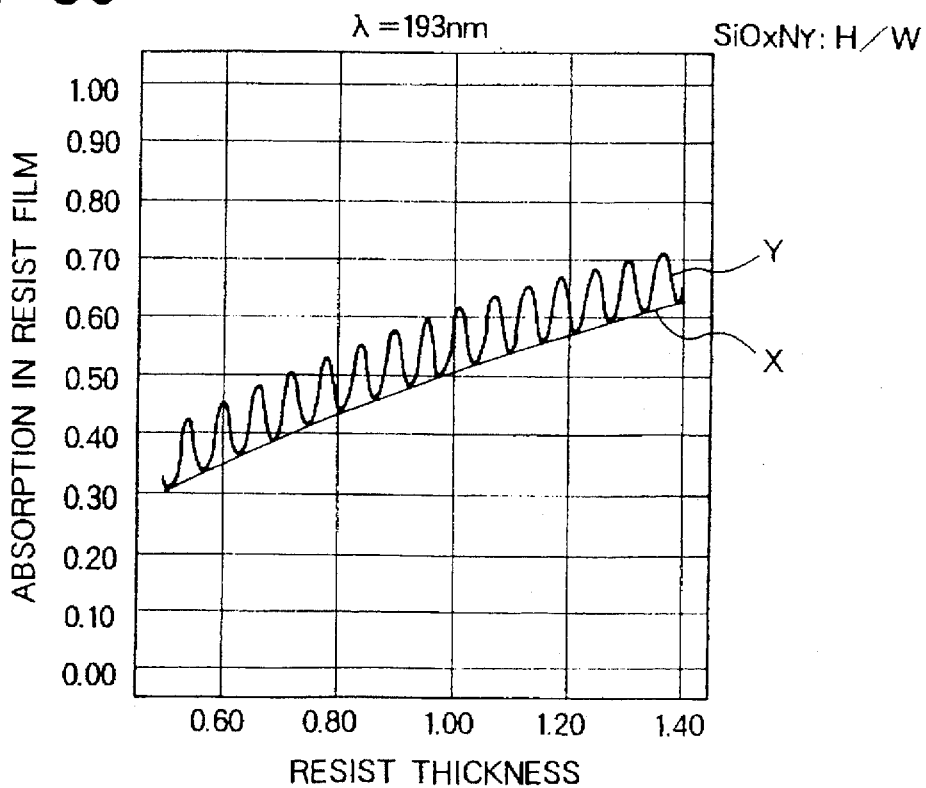
FIG. 30 is a graph of the reduction of the standing wave effect in the 11th example of the present invention (wavelength $\gamma=193$ nm)

The results of optimization to give the smallest standing wave effect at 248 nm and 193 nm are shown by the curves X in FIG. 29 (248 nm) and FIG. 30 (193 nm). These optimum values of the anti-reflection film were n=2.1, k=0.56, and a thickness of 33 nm at the wavelength of 248 nm and n=1.85, k=0.57, and a thickness of 17 nm at the wavelength of 193 nm. Note that in FIGS. 29 and 30, the standing wave effects in the case of patterning the resist film by photolithography without using the $SiO_xN_y$:H film as the anti-reflection film are shown by the curves Y.

Figure 31:
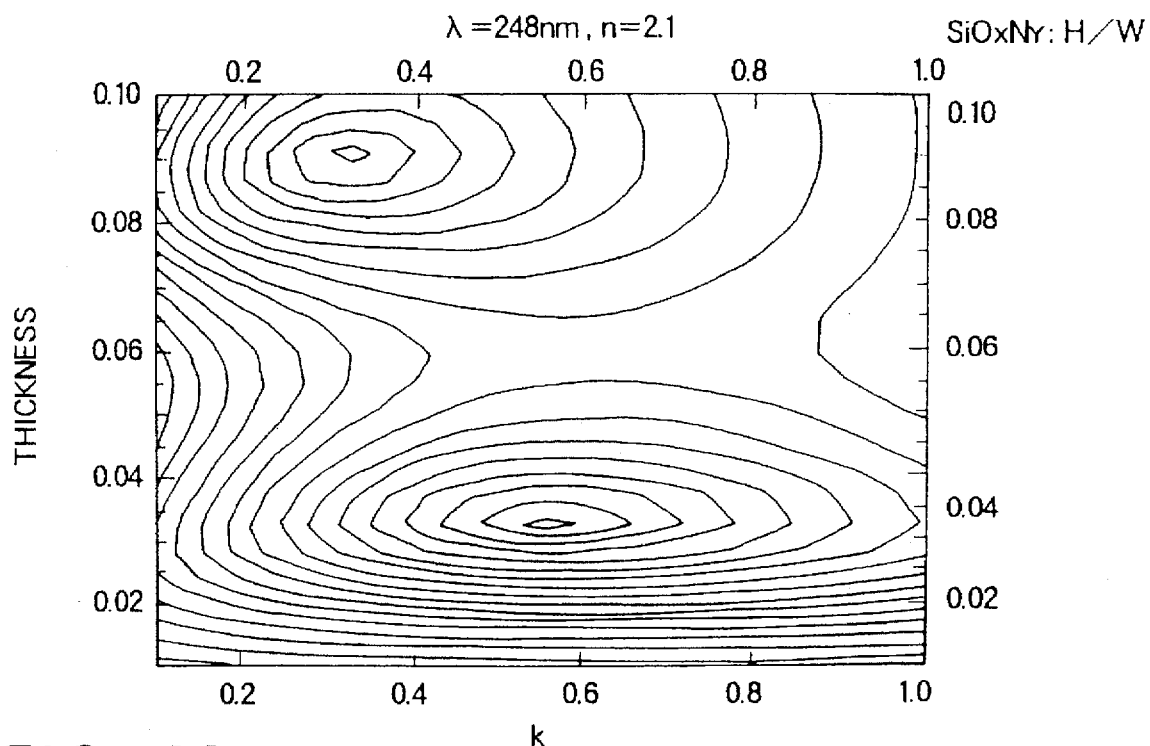
FIG. 31 is a graph of the results of the simulation of the standing wave effect in the case of changing the k and d of the anti-reflection film in the 11th example of the present invention (wavelength $\gamma=248$ nm)
Figure 32:
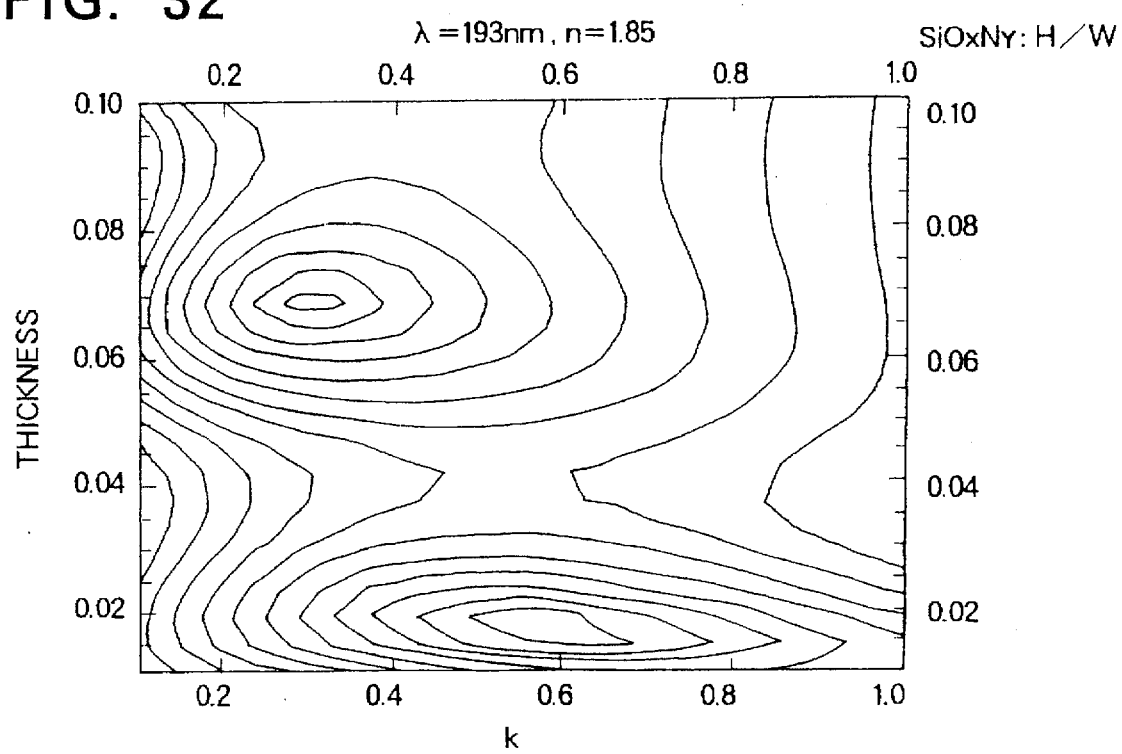
FIG. 32 is a graph of the results of the simulation of the standing wave effect in the case of changing the k and d of the anti-reflection film in the 11th example of the present invention (wavelength $\gamma=193$ nm).

The results of the simulation of the standing wave effect by an $SiO_xN_y$:H film in the case of fixing n (n=2.1 in the case of 248 nm wavelength and n=1.85 in the case of 193 nm wavelength) and changing k and the thickness d are shown in FIG. 31 (248 nm) and FIG. 32 (193 nm). From these figures, it is learned that there are optimal values where the standing wave is made 0 at k=0.32 and a thickness d of 92 nm at 248 nm and at k=0.3 and a thickness d of near 70 nm at 193 nm.

From these results, it is learned that to suppress the standing wave to less than 3 percent at an exposure wavelength of 248 nm, the optical constants and thickness d of the $SiO_xN_y$:H film should be set to n=2.1±0.2, k=0.48 to 0.67, and d=30 to 35 nm or n=2.1+0.2, k=0.25 to 0.4, and d=86 to 95 nm (248 nm wavelength). Further, at an exposure wavelength of 193 nm, they should be set to n=1.85±0.2, k=0.43 to 0.8, and d=14 to 22 nm or n=1.85±0.2, k=0.25 to 0.37, and d=65 to 73 nm.

By using an anti-reflection film of an $SiO_xN_y$:H film set to this range, when patterning the resist in a construction where an interlayer film is formed on tungsten and $SiO_xN_y$:H is formed as the anti-reflection film, it is possible to form a good pattern with little variation in width of interconnections, halation, etc. and, after etching, to obtain a pattern of tungsten having an excellent shape.

Further, by forming an interlayer film on tungsten and forming an optimized $SiO_xN_y$:H or $Si_xN_y$:H film between the tungsten and interlayer film or on top of the interlayer film and using the same to prevent reflection, it is possible to pattern a resist to an excellent shape in the same way as patterning a resist on tungsten.

As explained above, according to the present invention, it becomes possible to control the width of interconnections in the wafer plane to a high precision and to obtain a resist pattern or etching pattern of a good shape even with a silicide metal having a specific resistance smaller than the resistance of $WSi_x$, such as $TiSi_2$, $CoSi_2$, PtSi, or NiSi or even with a W metal.

Further, it is possible to form a good pattern even over step portions.

Further, it is possible to form a pattern with a large depth of focus.

Still further, it is possible to form a pattern with large exposure margin.

We claim:

1. A process for formation of a fine metal pattern having a width with little variation comprising the steps of:

forming a silicide metal film on an underlying substrate, said silicide metal film being selected from a group consisting of titanium silicide, cobalt silicide, platinum silicide and nickel silicide, forming an anti-reflection film on said underlying substrate on which said silicide metal film is formed, forming a resist film on said underlying substrate, patterning the resist film by photolithography to form a predetermined pattern, and using the thus patterned resist film as a mask and etching the silicide metal film on the underlying substrate to form the fine metal pattern, wherein the optical constants and the thickness of the anti-reflection film are determined to give the smallest standing wave effect at the time of the photolithography in accordance with the type of the silicide metal film and to enable the formation of the fine metal pattern.

2. The process for formation of a metal pattern as set forth in claim 1, further comprising the steps of forming said anti-reflection film on said silicide metal film, forming an interlayer film on said anti-reflection film, and forming said resist film on said interlayer film.

3. The process for formation of a metal pattern as set forth in claim 1, further comprising the steps of forming an interlayer film on said silicide metal film, forming said anti-reflection film on said interlayer film, and forming said resist film on said anti-reflection film.

4. The process for formation of a metal pattern as set forth in claim 1, wherein said anti-reflection film includes at least nitrogen and silicon as constituent elements.

5. The process for formation of a metal pattern as set forth in claim 4, wherein said anti-reflection film further includes oxygen as a constituent element.

6. The process for formation of a metal pattern as set forth in claim 1, wherein said silicide metal is titanium silicide and said anti-reflection film has optical constants of a real part (n) of the refractive index of at least 1.9 and not more than 2.3 and an imaginary part (k) of the refractive index of at least 0.6 and not more than 0.95 and a thickness of at least 18 nm and not more than 27 nm.

7. The process for formation of a metal pattern as set forth in claim 1, wherein said silicide metal is titanium silicide and said anti-reflection film has optical constants of a real part (n) of the refractive index of at least 1.9 and not more than 2.3 and an imaginary part (k) of the refractive index of at least 0.32 and not more than 0.45 and a thickness of at least 75 nm and not more than 85 nm.

8. The process for formation of a metal pattern as set forth in claim 1, wherein said silicide metal is one of cobalt silicide, platinum silicide, and nickel silicide and said anti-reflection film has optical constants of a real part (n) of the refractive index of at least 1.9 and not more than 2.3 and an imaginary part (k) of the refractive index of at least 0 and not more than 1.0 and a thickness of at least 10 nm and not more than 40 nm.

9. The process for formation of a metal pattern as set forth in claim 1, wherein said silicide metal is one of cobalt silicide, platinum silicide, and nickel silicide and said anti-reflection film has optical constants of a real part (n) of the refractive index of at least 1.9 and not more than 2.3 and an imaginary part (k) of the refractive index of at least 0.35 and not more than 1.35 and a thickness of at least 65 nm and not more than 95 nm.

10. The process for formation of a metal pattern as set forth in claim 2, wherein said silicide metal is titanium silicide and said anti-reflection film has optical constants of a real part (n) of the refractive index of at least 1.9 and not more than 2.3 and an imaginary part (k) of the refractive index of at least 0.7 and not more than 0.95 and a thickness of at least 15 nm and not more than 25 nm.

11. The process for formation of a metal pattern as set forth in claim 2, wherein said silicide metal is titanium silicide and said anti-reflection film has optical constants of a real part (n) of the refractive index of at least 1.9 and not more than 2.3 and an imaginary part (k) of the refractive index of at least 0.32 and not more than 0.47 and a thickness of at least 70 nm and not more than 78 nm.

12. The process for formation of a metal pattern as set forth in claim 2, wherein said silicide metal is selected from one of cobalt silicide, platinum silicide, and nickel silicide and said anti-reflection film has optical constants of a real part (n) of the refractive index of at least 1.9 and not more than 2.3 and an imaginary part (k) of the refractive index of at least 0 and not more than 1.0 and a thickness of at least 10 nm and not more than 40 nm.

13. The process for formation of a metal pattern as set forth in claim 2, wherein said silicide metal is one of cobalt silicide, platinum silicide, and nickel silicide and said anti-reflection film has optical constants of a real part (n) of the refractive index of at least 1.9 and not more than 2.3 and an imaginary part (k) of the refractive index of at least 0.35 and not more than 1.35 and a thickness of at least 65 nm and not more than 95 nm.

14. The process for formation of a metal pattern as set forth in claim 3, wherein said silicide metal is titanium silicide and said anti-reflection film has optical constants of a real part (n) of the refractive index of at least 1.9 and not more than 2.3 and an imaginary part (k) of the refractive index of at least 0.5 and not more than 0.7 and a thickness of at least 33 nm and not more than 38 nm.

15. The process for formation of a metal pattern as set forth in claim 3, wherein said silicide metal is titanium silicide and said anti-reflection film has optical constants of a real part (n) of the refractive index of at least 1.9 and not more than 2.3 and an imaginary part (k) of the refractive index of at least 0.25 and not more than 0.53 and a thickness of at least 86 nm and not more than 110 nm.

16. The process for formation of a metal pattern as set forth in claim 3, wherein said silicide metal is one of cobalt silicide, platinum silicide, and nickel silicide and said anti-reflection film has optical constants of a real part (n) of the refractive index of at least 1.9 and not more than 2.3 and an imaginary part (k) of the refractive index of at least 0 and not more than 1.0 and a thickness of at least 10 nm and not more than 40 nm.

17. The process for formation of a metal pattern as set forth in claim 3, wherein said silicide metal is one of cobalt silicide, platinum silicide, and nickel silicide and said anti-reflection film has optical constants of a real part (n) of the refractive index of at least 1.9 and not more than 2.3 and an imaginary part (k) of the refractive index of at least 0.35 and not more than 1.35 and a thickness of at least 65 nm and not more than 95 nm.

18. A process for formation of fine metal pattern having a width with little variation comprising the steps of:

forming a metal film serving as the basis of a silicide metal on an underlying substrate so that at least one part of said metal contacts the surface of silicon, said metal of the film being selected from a group consisting of titanium, cobalt, nickel and platinum, forming an anti-reflection film on the underlying substrate on which the metal film is formed, forming a resist film on said underlying substrate, patterning the resist film by photolithography to form a predetermined pattern, using the thus patterned resist film as a mask and etching the metal film on the underlying substrate to form the fine metal pattern, and applying a heat treatment to the thus etched metal film to convert the metal film to a metal silicide, wherein the optical constant and the thickness of the anti-reflection film are determined to give the smallest standing wave effect at the time of the photolithography in accordance with the type of the metal film and to enable the formation of the fine metal pattern.

19. The process for formation of a metal pattern as set forth in claim 18, further comprising the steps of forming said anti-reflection film on said silicide metal film, forming an interlayer film on the anti-reflection film, and forming said resist film on said interlayer film.

20. The process for formation of a metal pattern as set forth in claim 18, further comprising the steps of forming an interlayer film on said silicide metal film, forming said anti-reflection film on said interlayer film, and forming said resist film on said anti-reflection film.

21. The process for formation of a metal pattern as set forth in claim 18, wherein said anti-reflection film includes at least nitrogen and silicon as constituent elements.

22. The process for formation of a metal pattern as set forth in claim 21, wherein said anti-reflection film further includes oxygen as a constituent element.

23. The process for formation of a metal pattern as set forth in claim 18, wherein said metal film serving as the basis of said silicide metal is titanium and said anti-reflection film has optical constants of a real part (n) of the refractive index of at least 1.9 and not more than 2.3 and an imaginary part (k) of the refractive index of at least 0.5 and not more than 0.8 and a thickness of at least 20 nm and not more than 30 nm.

24. The process for formation of a metal pattern as set forth in claim 18, wherein said metal film serving as the basis of said silicide metal is titanium and said anti-reflection film has optical constants of a real part (n) of the refractive index of at least 1.9 and not more than 2.3 and an imaginary part (k) of the refractive index of at least 0.25 and not more than 0.4 and a thickness of at least 75 nm and not more than 85 nm.

25. The process for formation of a metal pattern as set forth in claim 18, wherein said metal film serving as the basis of said silicide metal is cobalt and said anti-reflection film has optical constants of a real part (n) of the refractive index of at least 1.9 and not more than 2.3 and an imaginary part (k) of the refractive index of at least 0.5 and not more than 0.7 and a thickness of at least 22 nm and not more than 28 nm.

26. The process for formation of a metal pattern as set forth in claim 18, wherein said metal film serving as the basis of said silicide metal is cobalt and said anti-reflection film has optical constants of a real part (n) of the refractive index of at least 1.9 and not more than 2.3 and an imaginary part (k) of the refractive index of at least 0.25 and not more than 0.4 and a thickness of at least 77 nm and not more than 83 nm.

27. The process for formation of a metal pattern as set forth in claim 18, wherein said metal film serving as the basis of said silicide metal is platinum and said anti-reflection film has optical constants of a real part (n) of the refractive index of at least 1.9 and not more than 2.3 and an imaginary part (k) of the refractive index of at least 0.5 and not more than 0.7 and a thickness of at least 22 nm and not more than 28 nm.

28. The process for formation of a metal pattern as set forth in claim 18, wherein said metal film serving as the basis of said silicide metal is platinum and said anti-reflection film has optical constants of a real part (n) of the refractive index of at least 1.9 and not more than 2.3 and an imaginary part (k) of the refractive index of at least 0.22 and not more than 0.4 and a thickness of at least 75 nm and not more than 87 nm.

29. The process for formation of a metal pattern as set forth in claim 18, wherein said metal film serving as the basis of said silicide metal is nickel and said anti-reflection film has optical constants of a real part (n) of the refractive index of at least 1.9 and not more than 2.3 and an imaginary part (k) of the refractive index of at least 0.48 and not more than 0.75 and a thickness of at least 22 nm and not more than 30 nm.

30. The process for formation of a metal pattern as set forth in claim 18, wherein said metal film serving as the basis of said silicide metal is nickel and said anti-reflection film has optical constants of a real part (n) of the refractive index of at least 1.9 and not more than 2.3 and an imaginary part (k) of the refractive index of at least 0.25 and not more than 0.4 and a thickness of at least 77.5 nm and not more than 88 nm.

31. A process for formation of a fine metal pattern having a width with little variation comprising the steps of:

forming a tungsten metal film on an underlying substrate, forming an anti-reflection film on said tungsten metal film directly or through an interlayer film, forming a resist film on this anti-reflection film, patterning the resist film by photolithography to form a predetermined pattern, and using the thus patterned resist film as a mask and etching the interlayer film and/or tungsten metal film on the underlying substrate to form the fine metal pattern, wherein the optical constant and the thickness of said anti-reflection film are determined to give the smallest standing wave effect at the time of the photolithography in accordance with the optical constant of the tungsten metal film and to enable the formation of the fine metal pattern.

32. The process for formation of a metal pattern as set forth in claim 31, wherein said anti-reflection film includes at least nitrogen and silicon as constituent elements.

33. The process for formation of a metal pattern as set forth in claim 32 wherein said anti-reflection film further includes oxygen as a constituent element.

* * * * *